United States Patent
Konishi et al.

[11] Patent Number: 6,154,505
[45] Date of Patent: Nov. 28, 2000

[54] BROADCAST RECEIVING APPARATUS

[75] Inventors: Takaaki Konishi, Ibaragi; Kazuya Ueda, Suita; Hisaya Kato, Hirakata; Kunio Ninomiya, Osaka, all of Japan

[73] Assignee: Matsushita Electric Industrial Co., Ltd., Osaka, Japan

[21] Appl. No.: 08/994,350

[22] Filed: Dec. 19, 1997

[30] Foreign Application Priority Data

Dec. 19, 1996 [JP] Japan .................................. 8-339306
Apr. 17, 1997 [JP] Japan .................................. 9-99917
May 8, 1997 [JP] Japan .................................. 9-117824

[51] Int. Cl.[7] .................................................. H03D 1/24
[52] U.S. Cl. ..................... 375/321; 348/729; 348/731; 455/204
[58] Field of Search .................................. 375/301, 270, 375/321; 348/729, 731; 455/204

[56] References Cited

U.S. PATENT DOCUMENTS

| 5,418,815 | 5/1995 | Ishikawa et al. | 375/321 |
| 5,506,636 | 4/1996 | Patel et al. | 348/725 |
| 5,673,293 | 9/1997 | Scarpa et al. | 375/321 |
| 5,715,012 | 2/1998 | Patel et al. | 348/725 |

*Primary Examiner*—Temesghen Ghebretinsae
*Attorney, Agent, or Firm*—Ratner & Prestia

[57] ABSTRACT

A broadcast receiving apparatus provides multifunctionality to cope with analog modulated input signals as well as digital input signals modulated by various types of modulation schemes. The apparatus comprises a detector for detecting the modulation scheme of input signals, and a switch for switching one or more of the characteristic of a filtering section, an amplifying section, and a detection section, depending upon the detected modulated scheme.

14 Claims, 20 Drawing Sheets

BROADCAST RECEIVING APPARATUS

FIELD OF THE INVENTION

The present invention relates to a broadcast receiving apparatus which can efficiently receive analog vestigial sideband (hereinafter abbreviated as VSB) modulated terrestrial broadcast such as analog NTSC broadcast, terrestrial digital broadcast based on various modulation schemes commercialization of which is currently being promoted in the Unites States and some other countries, and digital CATV broadcast based on various modulation schemes.

BACKGROUND OF THE INVENTION

Terrestrial broadcast has heretofore been transmitting amplitude-modulated signals, and CATV has also been transmitting amplitude-modulated signals. In the United States, it is expected that ATV (Advanced Television) system broadcast will start in 1998 as terrestrial digital broadcast.

Concerning the modulation system, a terrestrial broadcast is already in service which transmits digital data which has been 8VSB-modulated. In CATV industry, a service is being planned to transmit digital data which has been 16VSB-modulated. Some CATV operator has already started to provide a service to transmit QAM-modulated digital data.

In this way, there exist not only difference of analog and digital broadcast systems but also broadcast employing different modulation schemes intermingled making increasingly more types of broadcast available for reception at home.

As a practical example, there is broadcast of analog VSB-modulated signals as employed in the current NTSC system broadcast. A broadcast using VSB-modulated signals has a video carrier 19, an audio carrier 17, and a color sub-carrier 18 of which the frequency relationship is as shown in FIG. 15. In a typical television receiver, as shown in FIG. 16, analog VSB-modulated signals undergo frequency conversion to an intermediate frequency (IF) via a built-in analog VSB tuner 2, while the video band (containing a video carrier and a color sub-carrier) undergoes band limiting by means of a band limiting filter 4 such as a SAW filter and the like having a frequency characteristic 20 as shown in FIG. 15, followed by conversion to baseband signals by means of an AM detector 13 and video processing by means of an analog VSB video processor 9. In the audio band, the audio carrier undergoes band limiting by means of a band limiting filter 6 such as a SAW filter and the like having a frequency characteristic 16 as shown in FIG. 15, followed by FM detection and audio processing of the audio signals by means of an analog VSB signal processor 7.

In the AM detector 13 the construction of which is as shown in FIG. 18, by feeding into a mixer 28 an IF signal 23 obtained by frequency conversion by means of the analog VSB tuner 2 and a local oscillation signal from a local oscillator 30, a Quadrature signal 29, which is the difference between the IF signal 23 and the local oscillation signal, is obtained as an output from the mixer 28. The signal 29 is subsequently allowed to pass through a low-pass filter (LPF) 31 for conversion into an auto phase control (APC) voltage 32, which is then fed back to the local oscillator 30 of the AM detector to correct deviation in phase.

In the ATV system planned as a terrestrial digital broadcast, the terrestrial broadcast signal after digital VSB modulation is a modulated wave having a root raised cosine characteristic with a roll-off rate of 5.7% as shown in FIG. 17. Also, its construction from the tuner to the digital VSB detection is as shown in FIG. 19 according to a ATSC (advanced Television System Committee) Digital Television standard. A double super heterodyne tuner is employed as a tuner 42. VSB detection is done by first feeding to a mixer 25 an IF signal as frequency-converted by the tuner 24 and a signal from a local oscillator 30 after shifting the phase of the local oscillation frequency by 90 degrees, then feeding the Inphase signal 26 from the output of the mixer 25 to an LPF 34 and a limiting amplifier 35. On the other hand, the IF signal and the local oscillation signal from the local oscillator 30 are fed to a mixer 28 to obtain a Quadrature signal 29. By feeding the output of the limiting amplifier 35 and the Quadrature signal 29 to a mixer 36, an S-shaped signal as shown in FIG. 20 is obtained as an output from the mixer 36. This signal is then allowed to pass an LPF 33 for conversion to an APC voltage 32, which is fed back to a second local oscillator of the tuner 42 to correct deviation in phase.

FIG. 24 shows the construction of a broadcast receiving apparatus for VSB-modulated broadcast reception by taking as an example construction of a broadcast receiving apparatus down to the demodulator section of 8VSB-modulated signals for digital terrestrial broadcast and for 16VSB-modulated signals of digital CATV broadcast of the United States. The received signal is frequency-converted by a tuner 97, bandwidth limited by a band limiting filter 98, and detected by a detector 100, then the analog data is converted to digital data by an AD converter 101. Subsequent section is a digital processing section, where the AD-converted digital signal is fed to a synchronous detection circuit 102 to detect segment synchronous signal existent in the ATV format of the Unites States and field synchronous signal to a waveform equalizer circuit 103 to eliminate ghost as well as to correct waveform distortion, to a phase noise reduction circuit 104 to reduce the phase noise component produced in the tuner and others, and finally to an error correction circuit 106 to correct any data error, before inputting to a transport decoder 107 as a transport stream.

There exists another digital broadcast system, namely, CATV broadcast using QAM modulation. The construction down to a demodulator section of a QAM-modulated signal receiver to receive QAM-modulated digital CATV signal is as shown in FIG. 25. QAM-modulated signal is frequency-converted by a tuner 109, bandwidth limited by a band limiting filter 110, Inphase and Quadrature data is extracted by an orthogonal detector 112, and analog data is converted to digital data by an AD converter 113. The digital Inphase data and Quadrature data are fed to a carrier regeneration circuit 114 to correct frequency and phase, to waveform equalization circuits 115 and 116 to correct waveform distortion of the Inphase data and the Quadrature data, respectively, to a phase noise reduction circuit 117 to reduce phase noise component produced in the tuner and others, to a demapper circuit 119 to covert the Inphase and Quadrature data to serial data, and to an error correction circuit 120 to correct any data error, before inputting to a transport decoder 121 as a transport stream.

Since many broadcast signals having difference of either analog or digital and of modulation schemes are transmitted at the same time, it is necessary to prepare separate broadcast receiving apparatus to receive respective broadcast.

As a practical situation, it is likely that analog VSB-modulated terrestrial broadcast which can transmit one channel using one carrier wave, and digital VSB-modulated terrestrial broadcast which can transmit multiple channels using one carrier wave will come into wide use requiring separate broadcast receiving apparatus in order to receive analog VSB-modulated terrestrial broadcast and digital VSB-modulated terrestrial broadcast. In this case, it will be necessary either to prepare separate broadcast receiving apparatus or to prepare a broadcast receiving apparatus which can receive both analog VSB-modulated terrestrial broadcast and digital VSB-modulated terrestrial broadcast. However, if one tries to simply integrate functions of both receivers the cost would become very high.

In an area where digital terrestrial broadcast employs 8VSB modulation whereas digital CATV broadcast employs QAM modulation, in view of the economy and sharing of the receiver, it may be necessary to receive 8VSB-modulated signals of digital terrestrial broadcast and QAM-modulated signals of digital CATV broadcast with a single receiver. In this case, the circuit down to the demodulator section of a receiver for digital terrestrial broadcast and that of a receiver for digital CATV broadcast will require separate circuits because of the difference of modulation schemes in the 8VSB modulation, 16VSB modulation and QAM modulation. Consequently, if one wishes to receive both the 8VSB-modulated signals of digital terrestrial broadcast and QAM-modulated signals of digital CATV, there will arise a problem of increase in the receiver cost and the number of receivers required by a user.

SUMMARY OF THE INVENTION

Broadcast receiving apparatus in accordance with the present invention comprises a tuning section to be fed with modulated signals, a band-limiting first filtering section which is fed with signals obtained by tuning at the tuning section and frequency converting to an intermediate frequency signal (IF signal) and extracts a desired signal, an amplifying section to amplify the output of the first filtering section, and a detector section to detect the output of the amplifying section and convert to base-band signals. The tuner is provided with an input means for input of various modulated signals, a detection means to detect the modulation scheme of the inputted modulated signals, and a switching means to switch between the characteristic of one or more of the band-limiting filtering section, amplifying section, or detector section depending on the modulation scheme detected by the detection means.

The broadcast receiving apparatus is further provided in its digital processing section to process the detector output with an A/D converter section to convert analog signals to digital signals, a second filtering section that limits the band of and extracts a desired signal from the output of the A/D converter, and a switching means to switch over the characteristic of the second band-limiting filter section depending on the modulation scheme as detected by the detecting means.

The broadcast receiving apparatus is still further provided in its digital processing section to process the output of the detector with a waveform equalization section to equalize the waveform of the signals from the second filtering section and a switching means to switch over the characteristic of the waveform equalization section depending on the modulation scheme as detected by the detection means.

In this way it is possible to attain multifunctionality to cope with both analog and digital modulated signal inputs as well as to cope with digital signals modulated by various modulation schemes by sharing structural elements of a broadcast receiving apparatus or by switching characteristic of the structural elements, thereby making it possible to realize a multifunctional broadcast receiving apparatus with a simple circuit construction.

A special feature to be noted in this construction is that, by employing an AM detector only in the detector section in coping with digital modulated signal inputs, the construction has become simple, phase can always be locked at 0° only rather than at two points, namely, one at 0° and the other at 180°, such as the case with a VSB detector, and as an added feature the time to phase locking is shortened by feeding back to the local oscillator of the detector an APC voltage obtained by converting phase error of the signal to a voltage. Also, by controlling the amplification factor of the amplifier with a switching means so that it is kept constant in the course from the tuning section to the detector section input irrespective of the difference in the digital modulated signals to be inputted, it is possible to share the tuning section in coping with various modulated signal inputs. In this way, the present invention provides a broadcast receiving apparatus which can receive both 8VSB-modulated and 16VSB-modulated signals and digital QAM-modulated signals without calling for separate 8VSB- and 16VSB-modulated digital terrestrial broadcast receiving apparatus and digital QAM-modulated CATV broadcast receiving apparatus.

REFERENCE NUMERALS

1. Input
2. Analog VSB Tuner
3. Digital VSB Tuner
4, 5, 6, 12 Band Limiting Filter
7. VSB Audio Processor
8. AM/VSB Detector
9. VSB Video Processor
10. Digital VSB Processor
11. Trap Circuit
13. AM Detector
14. VSB Detector
15. VSB Tuner
16, 20, 21. Frequency Characteristic of Band Limiting Filter
17. Audio Carrier
18. Color Sub-carrier
19. Video Carrier
20. Pilot Signal
23. IF Signal
24. IF Amplifier
25, 28, 36. Mixer
26. Inphase
27. 90° Phase Shifter
28. Quadrature
30. Local Oscillator
31, 33, 34. LPF
32. APC voltage
35. Limiting Amplifier
38. Crystal
39. Capacitor
40. Resistor
41. Variable Capacitance Diode
42. Tuner
96, 108. Receiver Input
104, 117, 233. Phase Noise Reduction Circuit
112. Orthogonal Detector
114. Carrier Regeneration Circuit
119. Demapper Circuit
122. Band limiting Filter Output (Inphase of QAM)
123. Band Limiting filter Output (Quadrature of QAM)
202, 97, 109. Tuner
203. VSB/QAM Demodulator
204. Error Correction Circuit
235, 107, 121. Transport Decoder
206. Video Decoder
207. Audio Decoder
208. Video Output
209. Audio Output
210. Input Filter
211. RF Amplifier
212. 1st Mixer
213. 1st Local Oscillator
214. 1st IF Filter
215. 1st IF Amplifier
216. 2nd Mixer
217. 2nd Local Oscillator
218. 2nd IF Filter
219. 2nd IF Amplifier
220, 224, 229, 298, 110. Band Limiting Filter
221, 228, 230, 239, 281. Switch
222. Amplifier
223, 226, 100. Detector
225. Analog Processing Section
227, 101, 113. AD Converter
230, 102. Synchronous Detector Circuit
231. Carrier Regeneration Circuit
232, 103, 115, 116. Waveform Equalization Circuit
233, 104, 117. Phase Noise Reduction Circuit
234, 106, 120. Error Correction Circuit
236, 105, 118. Digital Processing Section
237. Filtering Coefficient for VSB
238. Filtering Coefficient for QAM
240. Band Limiting Filter Input
24–245, 271–280. Flip-Flop
246–250, 282–291. Multiplier
251, 292, 293, 294, 295, 124, 125. Adder
252. Band Limitting Filter for VSB
253. Data Input for VSB
254. Inphase Data Input for QAM
255. Quadrature Data Input for QAM
256. FIR Filter Section
257, 261. FIR Filter
258, 259. Subtractor
260. IIR Filter Section
262, 263, 264, 265. Coefficient Generator
266, 267. Error Detector
268. Waveform-Equalized Output for VSB
269. Inphase Waveform-Equalized Output for QAM
270. Quadrature Waveform-Equalized Output for QAM

DESCRIPTION OF THE PREFERRED EMBODIMENTS

Figure 1:
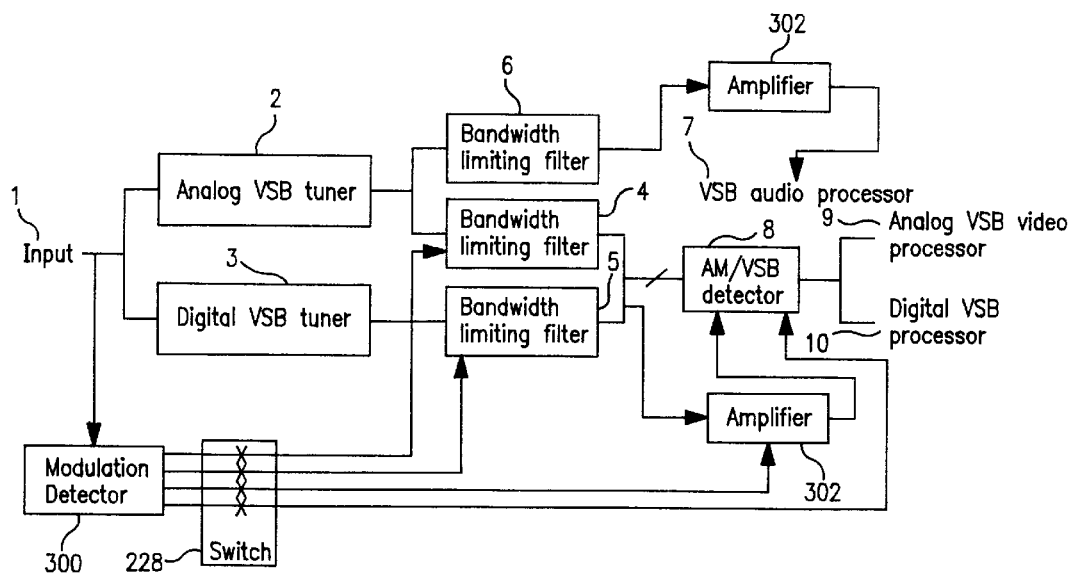
FIG. 1 shows a block-diagrammatic construction of a broadcast receiving apparatus in the first embodiment of the present invention.

First Embodiment:

FIG. 1 shows a block-diagrammatic construction of a broadcast receiving apparatus up to the detector section in an embodiment of the present invention. The tuning section consists of an analog VSB tuner 2 and a digital VSB tuner 3, and is provided with an input 1 which allows input of signals modulated by different modulation schemes. Modulation detector 300 detects the modulation scheme of the inputted modulated signals, and switch 228 switches characteristics of one or more of the band limiting filter, the amplifier, and the detector. The first filtering section comprises a band limiting filter 4 for analog video signals, a band limiting filter 5 for digital signals, and a band limiting filter 6 for analog audio signals, the entire section being so constructed that each of the filters functions in accordance with the type of incoming modulated signals. Amplifier 302 amplifies the output of the first filtering section. The detector section consists of a single AM/VSB detector 8 only.

In the following, a way of detecting analog VSB-modulated terrestrial signals and digital VSB-modulated terrestrial signals using the same detector will be explained. 2 is an analog VSB tuner to perform frequency conversion of analog VSB-modulated signals to IF signals, 3 is a digital VSB tuner to perform frequency conversion of digital VSB-modulated signals to IF signals, 4 is a band limiting filter to extract the video bandwidth (video carrier 19 and color sub-carrier 18) from the analog VSB-modulated signals as frequency converted to an IF signal, 5 is a band limiting filter to limit the bandwidth of the digital VSB-modulated signals as frequency converted to IF signals, 7 is an analog VSB audio processor to perform FM detection and audio processing of audio signals, 8 is an AM/VSB detector for detection of analog VSB-modulated signals and digital VSB-modulated signals and for conversion to base-band signals, 9 is an analog VSB video processor for video processing of AM detected base-band signals, and 10 is a digital VSB processor for video processing and audio processing of VSB detected signals.

Figure 18:
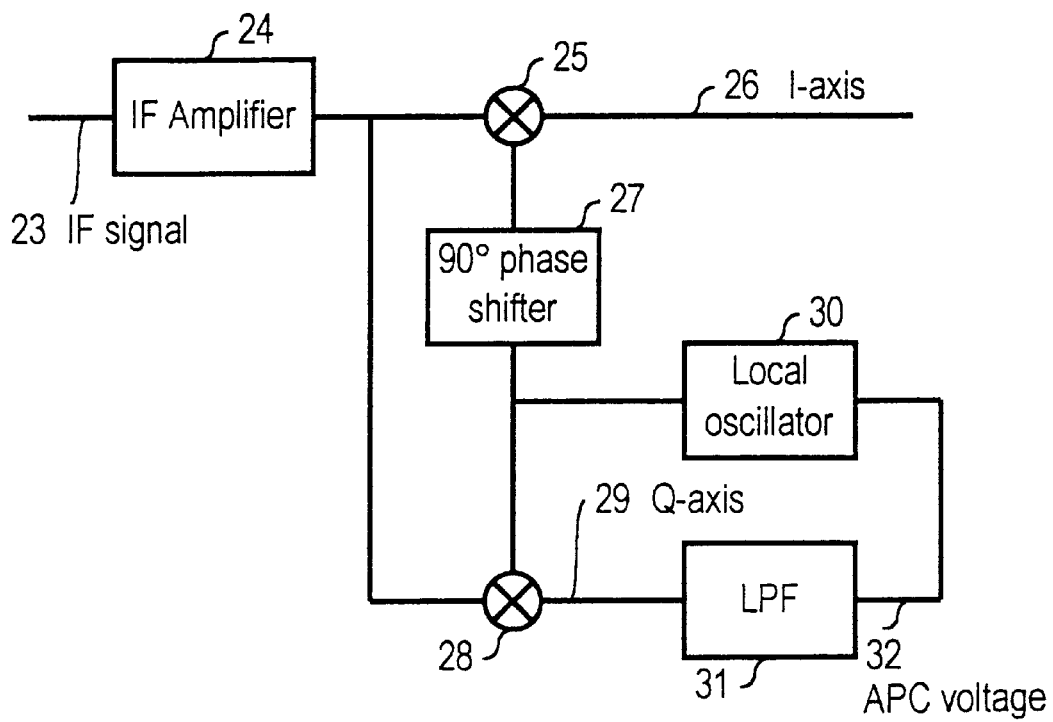
FIG. 18 shows a schematic construction of a conventional AM detector.

The AM/VSB detector 8 is an AM detector having a conventional construction as shown in FIG. 18. By feeding to an LPF 31 signals of Quadrature only as obtained by multiplying by means of a mixer 28 the local oscillation signal of a local oscillator 30 of the detector in FIG. 18 by an IF signal 23, an APC voltage is obtained, which is fed back to the local oscillator 30 of the AM detector to correct any deviation in phase. In this way, locking of the phase of the S-curve at two points, i.e., 0° and 180°, which is a problem with a digital VSB detector can be avoided thereby making it sure that the phase is always locked at 0° and making a circuit to reverse the phase when locked at 180° unnecessary. At the same time, since an APC voltage which is a voltage-converted phase error is fed back to the local oscillator 30 of the detector, the problem of a lengthy APC loop of otherwise feeding back the APC voltage to the second local oscillator of the detector can be avoided with an added effect of shortened time to APC locking.

Further, by composing the local oscillator of the AM/VSB detector 8 with a crystal oscillator, phase jitter of the oscillator can be minimized, resulting in minimized phase error due to APC, thereby allowing detection of analog VSB-modulated signals and digital VSB-modulated signals using the same detector.

Figure 15:
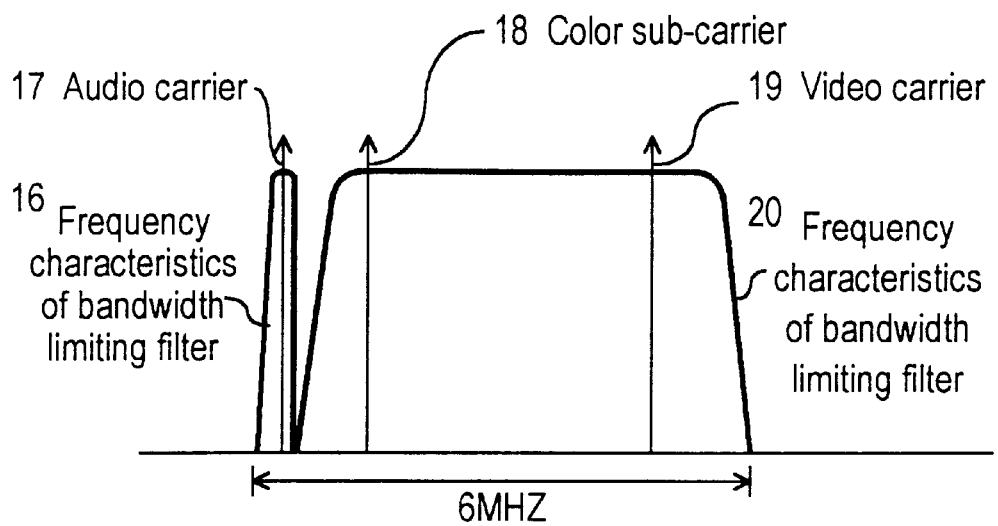
FIG. 15 shows frequency characteristic of a conventional band limiting filter for analog VSB-modulated signals.
Figure 16:
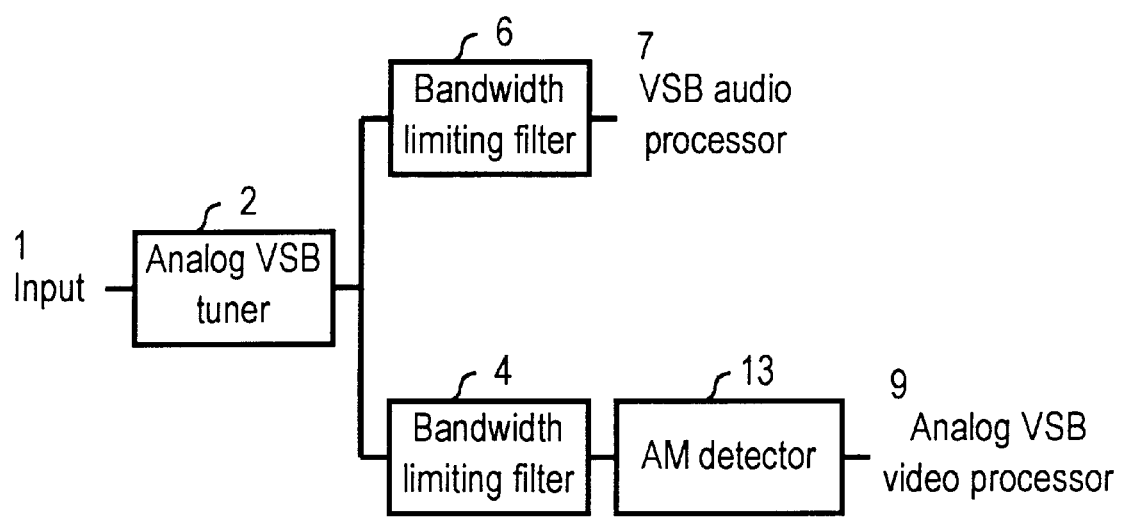
FIG. 16 shows a block-diagrammatic construction of an analog VSB receiving section of a conventional television receiver.

The band limiting filter 4 to extract video bandwidth (corresponding to video carrier 19 and color sub-carrier 18 in FIG. 15) of analog VSB-modulated terrestrial signals has a frequency characteristic as shown by curve 20 in FIG. 15 and attenuates audio carrier 17 at a distance 4.5 MHz from the video carrier 19, and the band limiting filter 6 to extract the audio carrier 17 which is 4.5 MHz apart from the video carrier 19 attenuates the video carrier 19 and the color sub carrier 18 at a point 3.58 MHz apart from the video carrier 19.

Figure 17:
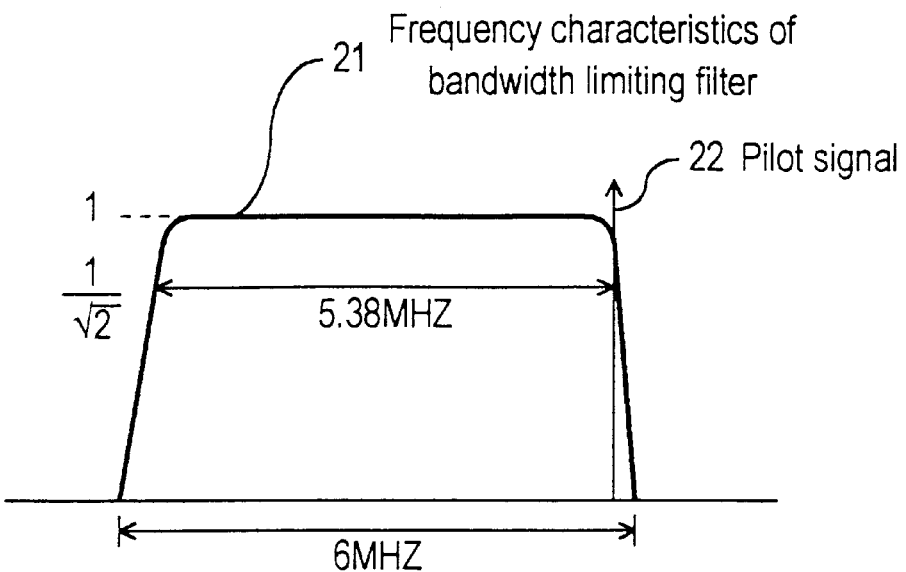
FIG. 17 shows frequency characteristic of a conventional bandwidth-limiting filter for digital VSB-modulated signals.

On the other hand, the band limiting filter 5 which limits the band of digital VSB-modulated signals has a frequency characteristic as shown in FIG. 17, namely, a root raised cosine curve with a roll-off rate of 5.76%. When compared to the analog VSB tuner 2, the digital VSB tuner 3 should have lower phase noise in the local oscillator signals, and its phase noise characteristic should be such that the phase noise is at least 70 dBc when detuned by 10 kHz.

When receiving analog VSB-modulated terrestrial signals, the video signals of the analog VSB-modulated signals are inputted to the analog VSB video processor 9 through the analog VSB tuner 2, band limiting filter 4, and the AM/VSB detector 8.

The audio signals of the analog VSB-modulated signals are inputted to the analog VSB audio processor 7 through the analog VSB tuner 2 and the band limiting filter 6.

When receiving digital VSB-modulated terrestrial signals, the digital VSB-modulated signals are inputted to the digital VSB processor 10 through the digital VSB tuner 3, the band limiting filter 5, and the AM/VSB detector 8.

Figure 2:
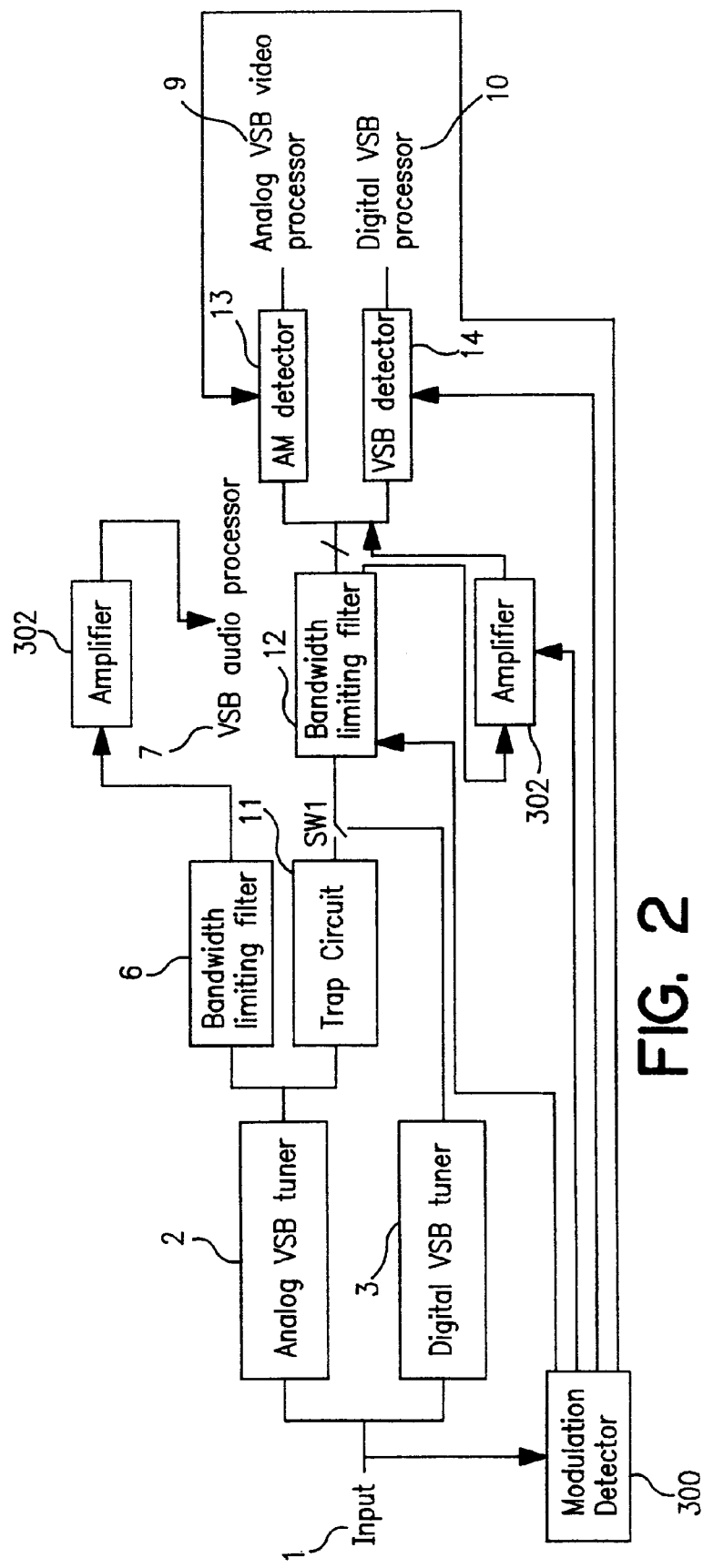
FIG. 2 shows a block-diagrammatic construction of a broadcast receiving apparatus in the second embodiment of the present invention.

Second Embodiment:

FIG. 2 shows a block-diagrammatic construction of a broadcast receiving apparatus up to the detector section in a further embodiment of the present invention. The tuning section consists of an analog VSB tuner 2 and a digital VSB tuner 3 just as in FIG. 1, and is fed with various modulated signals through an input means 1. Modulation detector 300 detects the modulation scheme of the inputted modulated signals, and switches characteristics of one or more of the band limiting filter, the amplifier, and the detector. The first filtering section is provided with a trap circuit 11 for analog signals, a band limiting filter 12 for common use for analog and digital signals, and a band limiting filter 6 for audio signals, either one of which becoming operational by a switching means (such as a switch 1) depending on the type of output from a detection means to detect modulated signals being inputted. Amplifier 302 amplifies the output of the first filtering section. The detector section comprises an AM detector 13 and a VSB detector 14.

Referring to FIG. 2, band limitation by using the same band limiting filter for analog VSB-modulated terrestrial signals and for digital VSB-modulated terrestrial signals will be explained in the following. The analog VSB tuner 2 converts analog VSB-modulated signals to IF signals, the digital VSB tuner 3 converts digital VSB signals to IF signals, the trap circuit 11 attenuates audio carrier 17 of the analog VSB-modulated signals, the band limiting filter 12 limits the bands of the analog VSB-modulated signals and the digital VSB-modulated signals, the band limiting filter 6 extracts audio carrier 17 from the analog VSB-modulated signals as converted to IF signals, the analog VSB audio processor 7 performs FM detection and audio processing on the audio signals, the AM detector 13 converts analog VSB-modulated signals to base-band signals, the VSB detector 14 converts the digital VSB-modulated signals to base-band signals, the analog VSB processor 9 performs video processing on AM-detected base-band signals, and the digital VSB processor 10 performs video processing and audio processing on VSB-detected signals.

Figure 21:
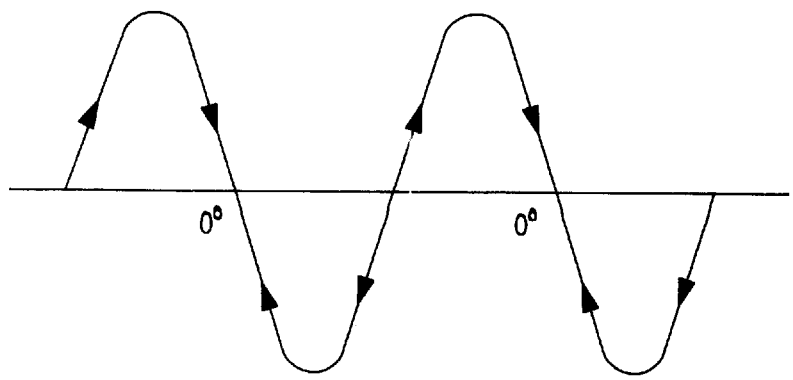
FIG. 21 shows Quadrature signal of a conventional AM detector.

In the AM detector 13 which has a construction as shown in FIG. 18, signals of Quadrature only as shown in FIG. 21 obtained by multiplying the local oscillation signal of a local oscillator 30 of the detector by the IF signal 23 by means of a mixer 28 are fed to an LPF 31 and converted to an APC voltage 32, which is fed back to the local oscillator 30 to correct any phase deviation.

Figure 19:
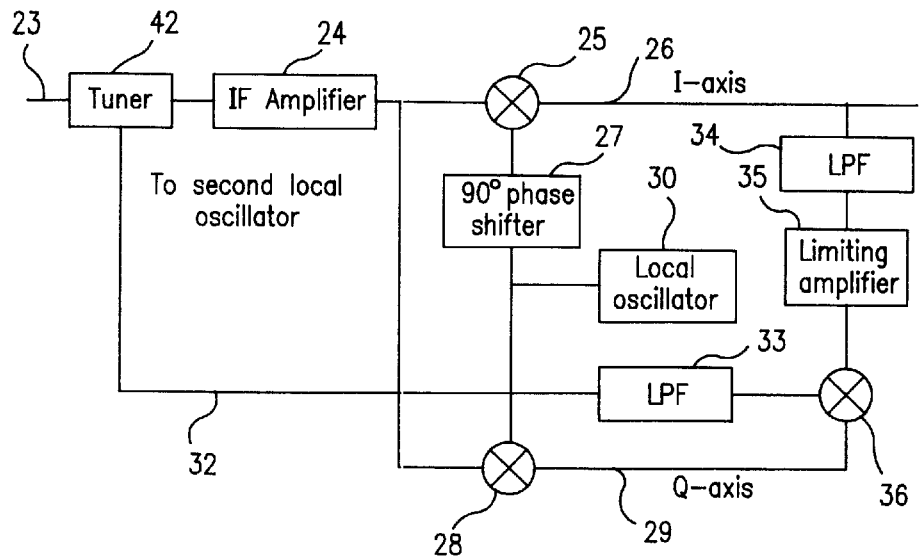
FIG. 19 shows a schematic construction of a conventional VSB detector.
Figure 20:
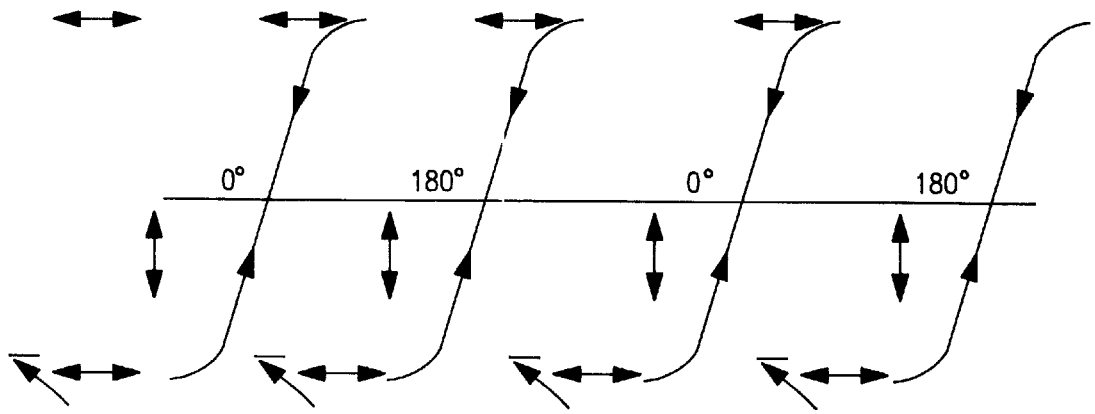
FIG. 20 shows S-curve characteristic of a conventional VSB detector.

In the VSB detector 14 which has a construction as shown in FIG. 19, the signals of Inphase 26 obtained by inputting to a mixer 25 IF signals as frequency converted by a tuner 42 and the local oscillation signals of the local oscillator 30 of the VSB detector as phase-shifted by 90° are fed to an LPF 34 and subsequently to a limiting amplifier 35. The output from the limiting amplifier 35, the IF signals, and the local oscillation signals from the local oscillator 30 of the VSB detector are fed to the mixer 28. By inputting Quadrature signals 29 of its output to a mixer 36, S-curved signals as shown in FIG. 20 are obtained as the output of the mixer 36, which are subsequently fed to an LPF 33 for conversion into an APC voltage 32, which is fed back to the second local oscillator of the tuner 42 for correction of any deviation in phase.

Figure 22:
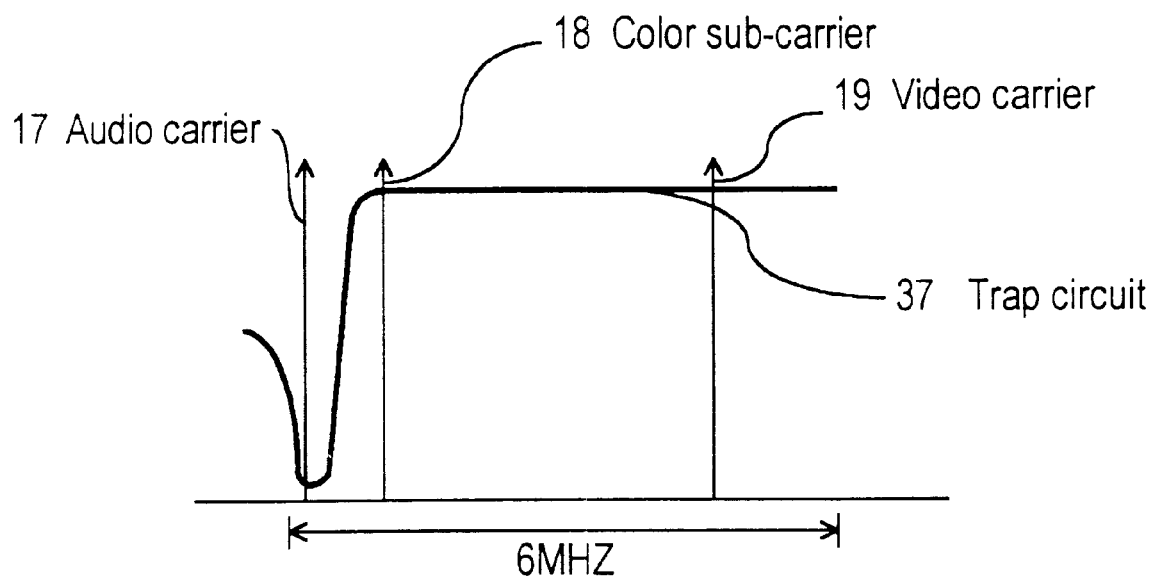
FIG. 22 shows frequency characteristic of a conventional trap circuit.
Figure 23:
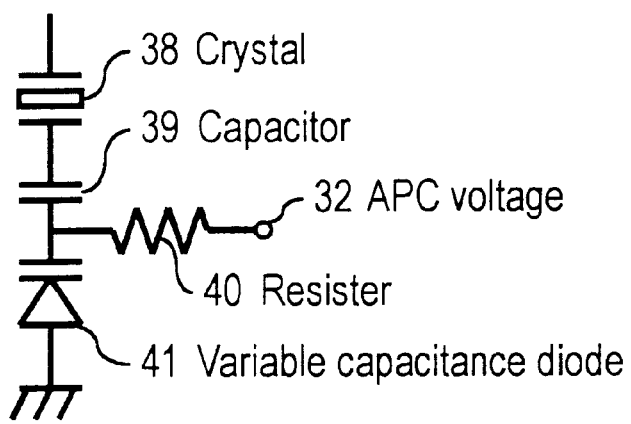
FIG. 23 shows the oscillation circuit of a local oscillator in a conventional AM/VSB detector.
Figure 24:
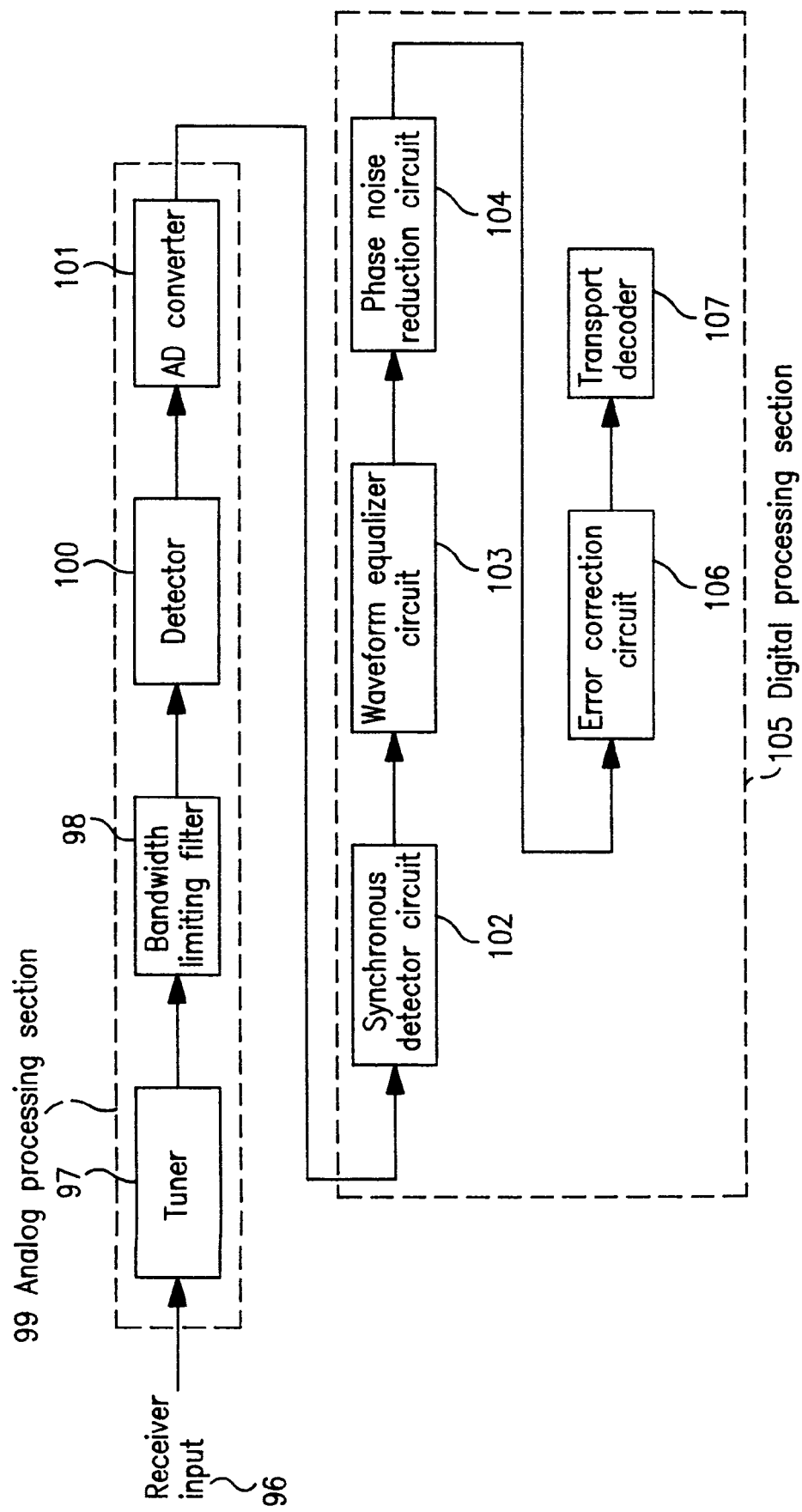
FIG. 24 shows a block-diagrammatic construction of a conventional VSB-modulated signal receiver.
Figure 25:
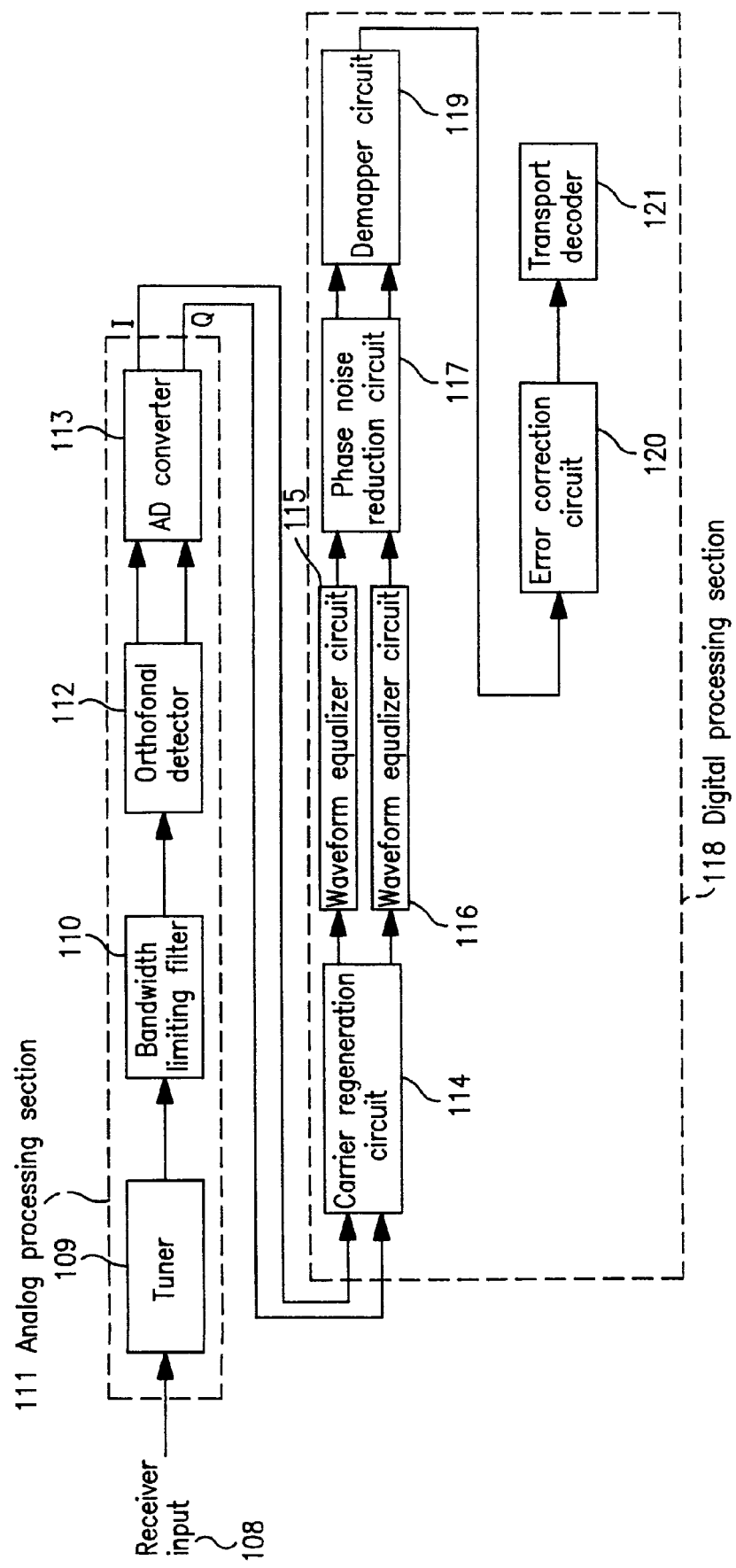
FIG. 25 shows a block-diagrammatic construction of a conventional QAM-modulated signal receiver.

The trap circuit 11 has a frequency characteristic as shown by FIG. 22 and attenuates the audio carrier 17 at a frequency 4.5 MHz apart from the video carrier 19. The frequency characteristic of the band limiting filter 12 which limits the band of the analog VSB-modulated signals and digital VSB-modulated signals is as shown in FIG. 17, namely, a root raised cosine curve with a roll-off rate of 5.67%. The band limiting filter 6 which extracts the audio carrier 17 at a frequency 4.5 MHz apart from the video carrier 19 has a frequency characteristic as shown by the curve 16 in FIG. 15, and attenuates the video carrier 19 and color sub-carrier 18 at a frequency 3.58 MHz apart from the video carrier 19. In the way described above, the present embodiment is characterized by having a filter which limits the bands of analog VSB-modulated terrestrial broadcast signals and digital VSB-modulated terrestrial broadcast signals before AM detection and VSB detection, and allows the signals to pass through a root raised cosine filter with a roll-off rate of 5.76% both when receiving analog VSB-modulated terrestrial signals and when receiving digital VSB-modulated terrestrial signals. The present embodiment is further characterized by having analog VSB-modulated terrestrial signals pass through a trap circuit that causes to attenuate the audio carrier before passing through the band limiting filter when receiving them.

When compared to the analog VSB tuner 2, the digital VSB tuner 3 should have lower phase noise in the local oscillator signals, and its phase noise characteristic should be such that the phase noise is at least 70 dBc when detuned by 10 kHz.

When receiving analog VSB-modulated terrestrial signals, the video signals of the analog VSB-modulated signals are allowed to pass through the analog VSB tuner 2, the trap circuit 11, the band limiting filter 12, the AM detector 13, before being inputted to the analog VSB video processor 9. The audio signals of the analog VSB-modulated signals are fed to the analog VSB audio processor 7 after passing through the analog VSB tuner 2 and the band limiting filter 6.

When receiving digital VSB-modulated terrestrial signals, the digital VSB-modulated signals are fed to the digital VSB processor 10 after passing through the digital VSB tuner 3, the band limiting filter 12, and the VSB detector 14.

Figure 3:
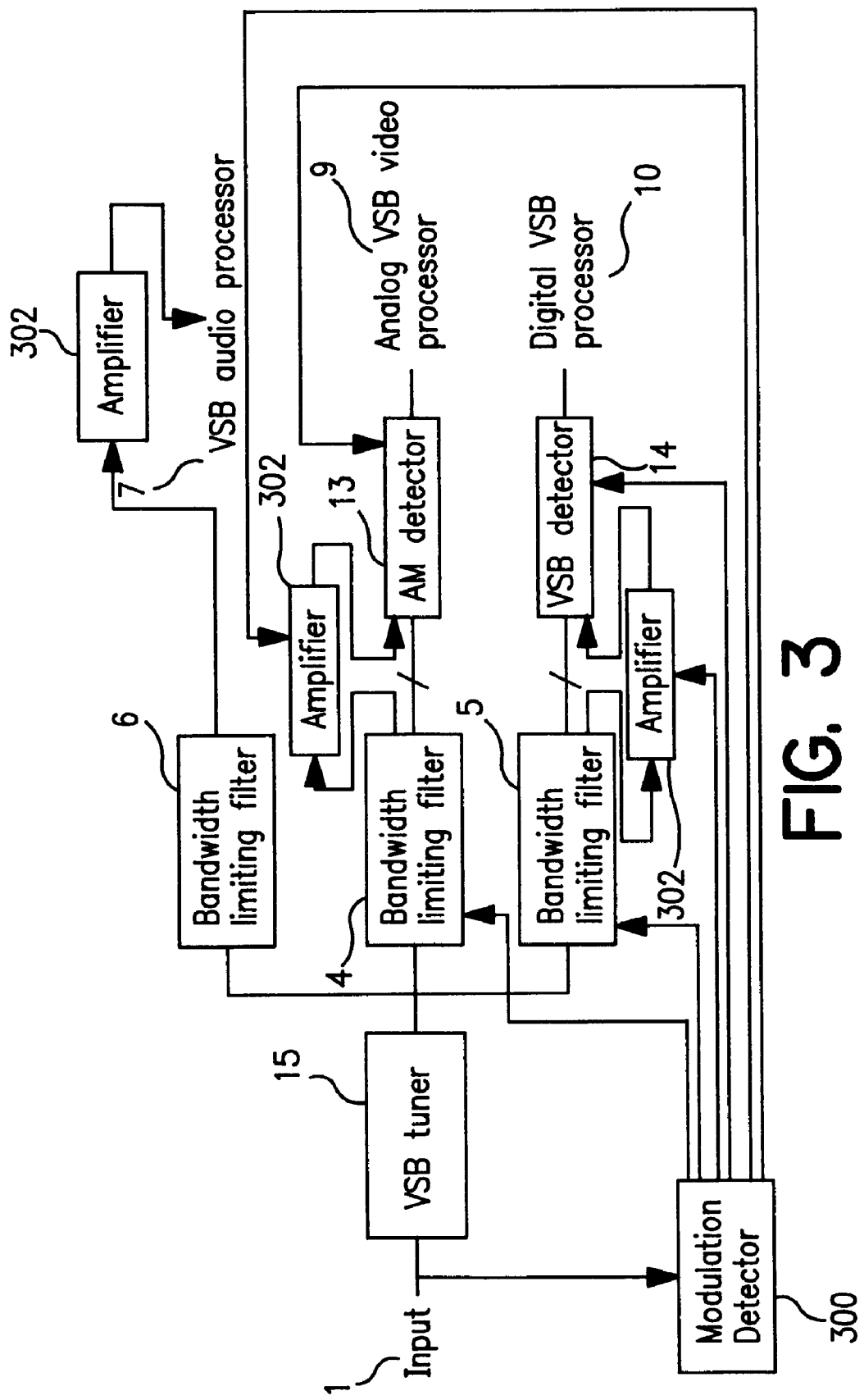
FIG. 3 shows a block-diagrammatic construction of a broadcast receiving apparatus in the third embodiment of the present invention.

Third Embodiment:

FIG. 3 shows a block-diagrammatic construction of a broadcast receiving apparatus up to the detector section in a further embodiment of the present invention. The tuning section consists of a VSB tuner 15 for common use for analog and digital broadcast signals and is fed with various modulated signals through an input means 1. Modulation detector 300 detects the modulation scheme of the inputted modulated signals, and switches characteristics of one or more of the band limiting filter, the amplifier, and the detector. The first filtering section is provided with a band limiting filter 4 for analog signals, a band limiting filter 5 for digital signals, and a band limiting filter 6 for audio signals, either one of which becoming operational by a switching means depending on the type of output from a detection means to detect modulated signals being inputted. Amplifier 302 amplifies the output of the first filtering section. The VSB detector section comprises an AM detector 13 and a VSB detector 14.

Referring to FIG. 3, frequency conversion to IF signals by using the same tuner for analog VSB-modulated terrestrial signals and for digital VSB-modulated terrestrial signals will be explained in the following. A VSB tuner 15 converts the analog VSB-modulated signals and the digital VSB-modulated signals to IF signals, a band limiting filter 4 extracts the video band (video carrier 19 and color sub-carrier 18) of the analog VSB-modulated signals as converted to IF signals, a band limiting filter 5 limits the band of digital VSB-modulated signals as converted to IF signals, a band limiting filter 6 to extract the audio carrier 17 of the analog VSB-modulated signals as converted to IF signals, an analog VSB audio processor 7 performs FM detection and audio processing on the audio signals, an AM detector 13 converts the analog VSB-modulated signals to base-band signals, a VSB detector 14 converts the digital VSB-modulated signals to base-band signals, an analog VSB processor 9 performs video processing on the AM detected base-band signals, and a digital VSB processor 10 performs video processing and audio processing on the VSB detected signals.

In order to lower the phase noise, which will lead to deterioration of the performance, of the local oscillator of the tuner when feeding digital VSB-modulated. signals to the tuner, a double super heterodyne tuner of which the phase noise of the local oscillator is at least 70 dBc when detuned by 10 kHz is employed as the VSB tuner 15, thereby allowing frequency conversion of analog VSB-modulated terrestrial signals and digital VSB-modulated signals using the same tuner.

The AM detector 13 has a construction shown in FIG. 18, in which signals of the Quadrature only as obtained by multiplying the local oscillation signal of the local oscillator 30 of the detector and the IF signal 23 by a mixer 28 is fed to an LPF 31 for conversion to an APC voltage, which is fed back to the local oscillator 30 of the AM detector to correct any deviation in phase.

The VSB detector 14 has a construction as shown in FIG. 19, in which Inphase signals 26 obtained by feeding to a mixer 25 IF signals as frequency-converted by a tuner 42 and a signal obtained by shifting 90° the phase of the local oscillation signal of the local oscillator 30 of the VSB detector are fed to an LPF 34 and to a limiting amplifier 35, and the output of which are fed to a mixer 28 together with the IF signals and the local oscillation signal of the local oscillator 30 of the VSB detector. Quadrature signals 29 of the mixer 28 is then fed to a mixer 36 to obtain S-curve signals as shown in FIG. 20, which are fed back to the second local oscillator of the tuner 42 after passing through an LPF 33 thereby converting to an APC voltage 32 for correction of any deviation in phase.

The band limiting filter 4 to extract the video band (video carrier 19 and color sub-carrier 17) from analog VSB-modulated terrestrial signals has a characteristic as shown by a curve 20 in FIG. 15, with which the audio carrier 17 is attenuated at a frequency 4.5 MHz apart from the video carrier 19, whereas the band limiting filter 6 to extract the audio carrier 17 at a frequency 4.5 MHz apart from the video carrier 19 attenuates the color sub-carrier 18 at the video carrier frequency 19 and at a frequency 3.58 MHz apart from the video carrier 19.

The band limiting filter 5 to limit the band of digital VSB-modulated signals has a frequency characteristic as shown in FIG. 17, namely, a root raised cosine curve with a roll-off rate of 5.76%.

When receiving analog VSB-modulated terrestrial signals, the video signals of the analog VSB-modulated signals are inputted to the analog VSB processor 9 after passing through the VSB tuner 15, the band limiting filter 4, and the AM detector 13. The audio signals of the analog VSB-modulated signals are inputted to the analog VSB audio processor 7 after passing through the VSB tuner 15 and the band limiting filter 6.

When receiving digital VSB-modulated terrestrial signals, the digital VSB-modulated signals are inputted to the digital VSB processor 10 after passing through the VSB tuner 15, the band limiting filter 5, and the VSB detector 14.

Figure 4:
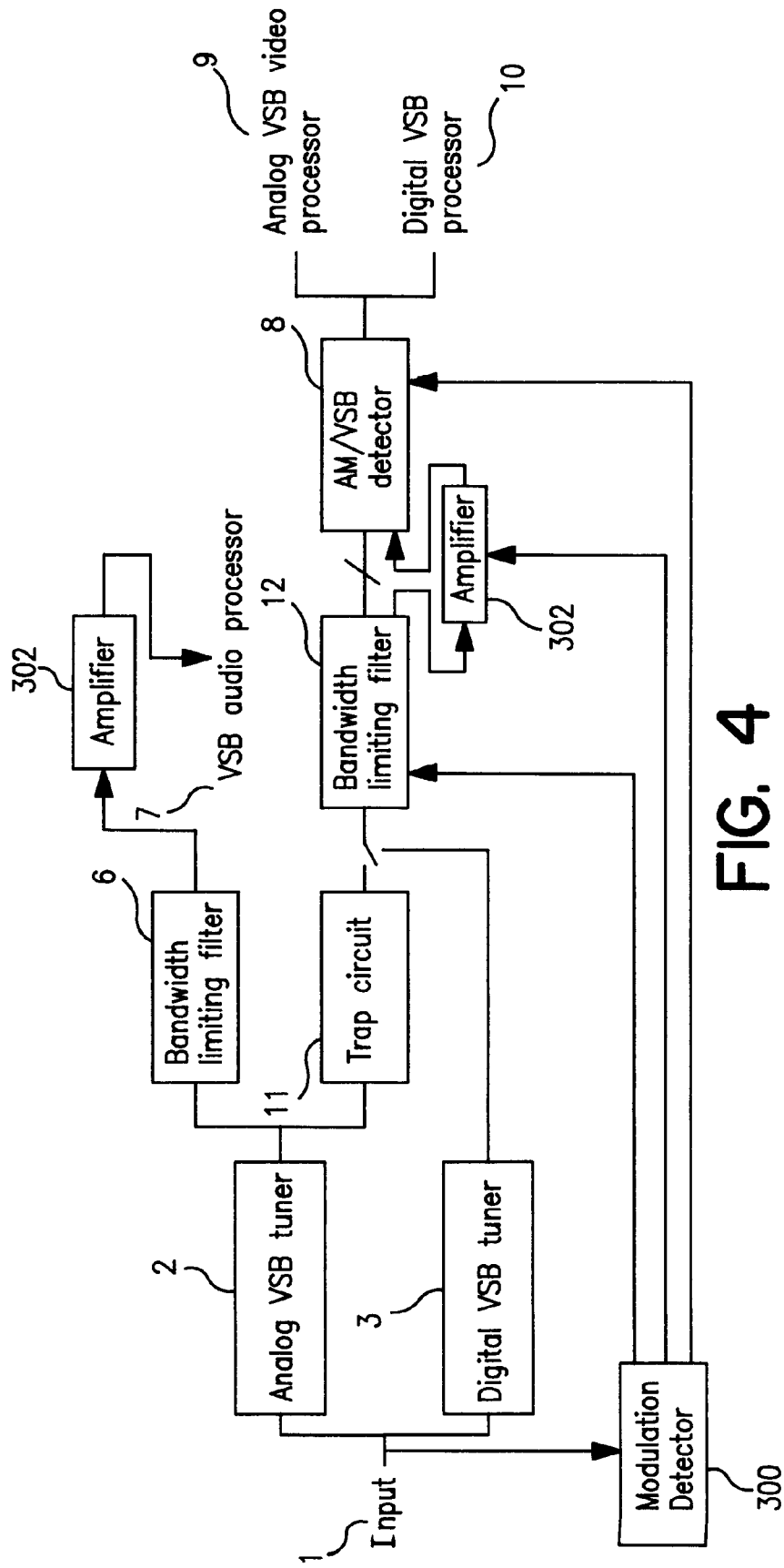
FIG. 4 shows a block-diagrammatic construction of a broadcast receiving apparatus in the forth embodiment of the present invention.

Fourth Embodiment:

FIG. 4 shows a block-diagrammatic construction of a broadcast receiving apparatus up to the detector section in a further embodiment of the present invention. The tuning section consists of an analog VSB tuner 2 and a digital VSB tuner 3 as in FIG. 2 and is fed with various modulated signals through an input means 1. Modulation detector 300 detects the modulation scheme of the inputted modulated signals, and switches characteristics of one or more of the band limiting filter, the amplifier, and the detector. The first filtering section is provided with a trap circuit 11 for analog signals as in FIG. 2, a band limiting filter 12 for common use for analog and digital signals, and a band limiting filter 6 for audio signals, either one of which becoming operational by a switching means (such as a switch 1) depending on the type of output from a detection means to detect modulated signals being inputted. Amplifier 302 amplifies the output of the first filtering section. The detector section consists of an AM/VSB detector 8.

Referring to FIG. 4, explanation will be made in the following on the detection of analog VSB-modulated terrestrial signals and digital VSB-modulated terrestrial signals using the same detector, and on limiting the band using the same band limiting filter. An analog VSB tuner 2 frequency-converts the analog VSB-modulated signals to IF signals, a digital VSB tuner 3 frequency-converts the digital VSB-modulated signals to IF signals, a trap circuit 11 attenuates audio carrier 17 of the analog VSB-modulated signals, a band limiting filter 12 limits the band of the analog VSB-modulated signals and the digital VSB-modulated signals, a band limiting filter 6 extracts the audio carrier 17 from the analog VSB-modulated signals as converted to IF signals, an analog VSB audio processor 7 performs FM detection and audio processing of the audio signals, an AM/VSB detector 8 detects the analog VSB. modulated signals and digital VSB-modulated signals and converts to base-band signals, an analog VSB processor 9 performs video processing of AM-detected base. band signals, and a digital VSB processor 10 performs video processing and audio processing on the detected VSB signals.

The AM/VSB 8 has a construction as shown in FIG. 18 in which only the Quadrature signals as shown in FIG. 21 and obtained by multiplying the local oscillation signals of a local oscillator 30 of the detector and IF signals 23 by means of a mixer 28 are fed to an LPF 31 for conversion to an APC voltage 32, which is fed back to the local oscillator 30 of the AM detector for correction of any deviation in phase.

The trap circuit 11 has a frequency characteristic as shown in FIG. 22 and attenuates the audio carrier 17 at a frequency 4.5 MHz apart from the video carrier 19. The frequency characteristic of the band limiting filter 6 to extract the video signals of the analog VSB-modulated terrestrials signals has a frequency characteristic as shown by the curve 20 in FIG. 15 and attenuates the audio carrier 17 at a frequency 4.5 MHz apart from the video carrier 19. The band limiting filter 6 to extract the audio carrier 17 at a frequency 4.5 MHz apart from the video carrier 19 attenuates the video carrier 19 and color sub-carrier 18 at a frequency 3.58 MHz apart from the video carrier 19. The band limiting filter 12 to limit the band of the digital VSB-modulated signals has a frequency characteristic as shown in FIG. 17, a root raised cosine curve with a roll-off rate of 5.76%.

When compared to the analog VSB tuner 2, the digital VSB tuner 3 should have lower phase noise in the local oscillator signals, and its phase noise characteristic should be such that the phase noise is at least 70 dBc when detuned by 10 kHz.

When receiving analog VSB-modulated terrestrial signals, video signals of the analog VSB-modulated signals are fed to the analog VSB video processor 9 after passing through the analog VSB tuner 2, the trap circuit 11, the band limiting filter 12, and the AM/VSB detector 8. The audio signals of the analog VSB-modulated signals are fed to the analog VSB audio processor 7 after passing through the analog VSB tuner 2 and the band limiting filter 6.

When receiving digital VSB-modulated terrestrial signals, the digital VSB-modulated signals are fed to the digital VSB processor 10 after passing through the digital VSB tuner 3, the band limiting filter 12, and the AM/VSB detector 8.

Figure 5:
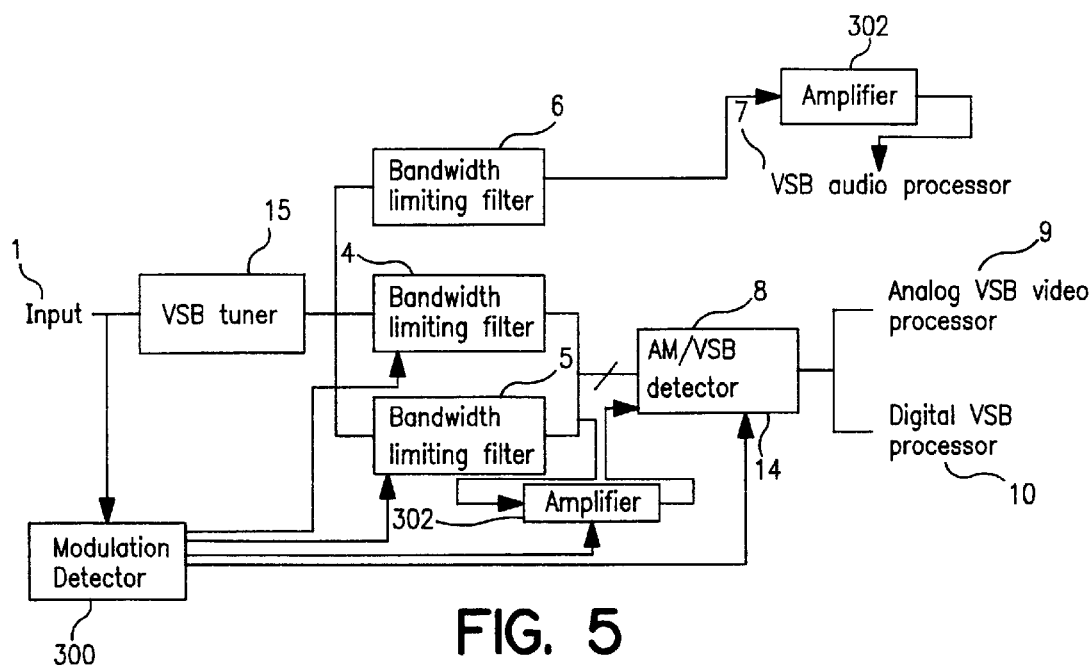
FIG. 5 shows a block-diagrammatic construction of a broadcast receiving apparatus in the fifth embodiment of the present invention.

Fifth Embodiment:

FIG. 5 shows a block-diagrammatic construction of a broadcast receiving apparatus up to the detector section in a further embodiment of the present invention. The tuning section consists of a VSB tuner 15 for common use for analog and digital signals and is fed with various modulated signals through an input means 1. Modulation detector 300 detects the modulation scheme of the inputted modulated signals, and switches characteristics of one or more of the band limiting filter, the amplifier, and the detector. The first filtering section is provided with a band limiting filter 4 for analog signals, a band limiting filter 5 for digital signals, and a band limiting filter 6 for audio signals, either one of which becoming operational by a switching means depending on the type of output from a detection means to detect modulated signals being inputted. Amplifier 302 amplifies the output of the first filtering section. The detector section consists of an AM/VSB detector 15 alone.

Referring to FIG. 5, frequency conversion to IF signals by using the same tuner, and detection by using the same detector, for analog VSB-modulated terrestrial signals and for digital VSB-modulated terrestrial signals will be explained in the following. A VSB tuner 15 converts the analog VSB-modulated signals and the digital VSB-modulated signals to IF signals, a band limiting filter 4 extracts the video band (video carrier 19 and color sub-carrier 18) from the analog VSB-modulated signals as converted to IF signals, a band limiting filter 5 limits the band of the digital VSB-modulated signals as frequency converted to IF signals, a band limiting filter 6 extracts the audio carrier 17 from the analog VSB-modulated signals as converted to IF signals, an analog VSB audio processor 7 performs FM detection and audio processing on the audio signals, an AM/VSB detector 8 detects the analog VSB-modulated signals and the digital VSB-modulated signals and converts to base-band signals, an analog VSB processor 9 performs video processing on the AM-detected base-band signals, and a digital VSB processor 10 performs video processing and audio processing on the VSB-detected signals.

The AM/VSB 8 has a construction as shown in FIG. 18 in which only the Quadrature signals as shown in FIG. 21 and obtained by multiplying the local oscillation signals of a local oscillator 30 of the detector and the IF signals 23 by means of a mixer 28 are fed to an LPF 31 for conversion to an APC voltage 32, which is fed back to the local oscillator 30 of the AM detector for correction of any deviation in phase.

The band limiting filter 4 to extract video signals from the analog VSB-modulated terrestrial signals has a frequency characteristic as shown by the curve 20 in FIG. 15 and attenuates the audio carrier 17 at a frequency 4.5 MHz apart from the video carrier 19. The band limiting filter 6 to extract the audio carrier 17 at a frequency 4.5 MHz apart from the video carrier 19 attenuates the video carrier 19 and the color sub-carrier 18 at a frequency 3.58 MHz apart from the video carrier 19. A band limiting filter 12 to limit the band of the digital VSB-modulated signals has a frequency characteristic as shown in FIG. 17, a root raised cosine curve with a roll-off rate of 5.76%.

When receiving analog VSB-modulated terrestrial signals, the analog VSB-modulated video signals are fed to the analog VSB video processor 9 after passing through the VSB tuner 15, the band limiting filter 4, and the AM/VSB detector 8. The audio signals of the analog VSB-modulated signals are fed to the analog VSB audio processor 7 after passing through the VSB tuner 15 and the band limiting filter 6.

When receiving digital VSB-modulated terrestrial signals, the digital VSB-modulated signals are fed to the digital VSB processor 10 after passing through the VSB tuner 15, the band limiting filter 5, and the AM/VSB detector 8.

Figure 6:
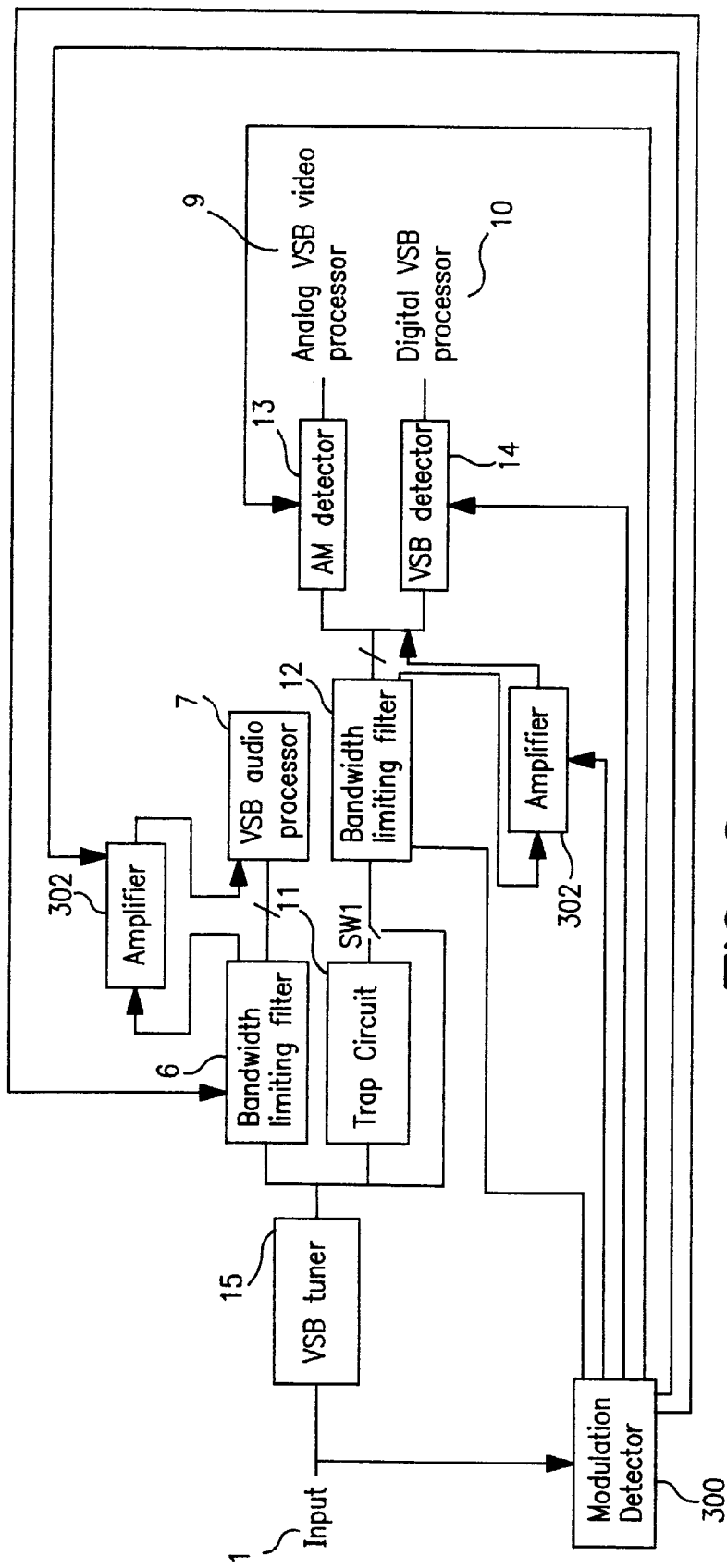
FIG. 6 shows a block-diagrammatic construction of a broadcast receiving apparatus in the sixth embodiment of the present invention.

Sixth Embodiment:

FIG. 6 shows a block-diagrammatic construction of a broadcast receiving apparatus in a further embodiment of the present invention. The tuning section consists of a VSB tuner 15 alone and is fed with various modulated signals through an input means 1. Modulation detector 300 detects the modulation scheme of the inputted modulated signals, and switches characteristics of one or more of the band limiting filter, the amplifier, and the detector. The first filtering section is provided with a trap circuit 11 for analog signals, a band limiting filter 12 for common use for analog signals and digital signals, and a band limiting filter 6 for audio signals, either one of which becoming operational by a switching means (such as a switch 1) depending on the type of output from a detection means to detect modulated signals being inputted. Amplifier 302 amplifies the output f the first filtering section. The detection section consists of an AM detector 13 and a VSB detector 14.

Referring to FIG. 6, frequency conversion to IF signals by using the same tuner, and band limiting by using the same band limiting filter, for analog VSB modulated terrestrial signals and for digital VSB-modulated terrestrial signals will be explained in the following. A VSB tuner 15 converts the analog VSB-modulated terrestrial signals and the digital VSB-modulated terrestrial signals to IF signals, a trap circuit 11 attenuates the audio carrier 17 of the analog VSB-modulated signals, a band limiting filter 12 limits the bands of the analog VSB-modulated signals and the digital VSB-modulated signals, a band limiting filter 6 extracts the audio carrier 17 from the analog VSB-modulated signals as converted to IF signals, an analog VSB audio processor 7 performs FM detection and audio processing of the audio signals, an AM detector 13 converts the analog VSB-modulated signals to base-band signals, a VSB detector 14 converts the digital VSB-modulated signals to base-band signals, an analog VSB processor 9 performs video processing on AM-detected base-band signals, and a digital VSB processor 10 performs video processing and audio processing on the VSB-detected signals.

The AM detector 13 has a construction as shown in FIG. 18, in which only the Quadrature signals as shown in FIG. 21 and obtained by multiplying the local oscillation signals of a local oscillator 30 of the detector and the IF signals 23 by means of a mixer 28 are fed to an LPF 31 for conversion to an APC voltage 32, which is fed. back to the local oscillator 30 of the AM detector for correction of any deviation in phase.

The VSB detector 14 has a construction as shown in FIG. 19, in which Inphase signals 26 obtained by feeding to a mixer 25 IF signals as frequency-converted by a tuner 42 and a signal obtained by shifting 90° the phase of the local oscillation signal of the local oscillator 30 of the VSB detector are fed to an LPF 34 and to a limiting amplifier 35, the output of which and IF signals and the local oscillation signal of the local oscillator 30 of the VSB detector are fed to a mixer 28. Quadrature signals 29 as the output of the mixer 28 is then fed to a mixer 36 to obtain S-curve signals as shown in FIG. 20, which are fed back to the second local oscillator of the tuner 42 after passing through an LPF 33 and converting to an APC voltage 32 for correction of any deviation in phase.

The trap circuit 11 has a frequency characteristic as shown in FIG. 22 and attenuates the audio carrier 17 at a frequency 4.5 MHz apart from the video carrier 19.

The band limiting filter 12 to limit the band of the analog VSB-modulated signals and the digital VSB-modulated signals has a frequency characteristic as shown in FIG. 17, a root raised cosine curve with a roll-off rate of 5.76%.

The band limiting filter 6 has a frequency characteristic as shown by the curve 16 in FIG. 15, and attenuates the video carrier 19 and the color sub-carrier 18 at a frequency 3.58 MHz apart from the video carrier 19.

When receiving analog VSB-modulated terrestrial signals, the video signals of the analog VSB-modulated signals are inputted to the analog VSB video processor 9 through the VSB tuner 15, the trap circuit 11, the band limiting filter 12, and the AM detector 13.

Audio signals of the analog VSB-modulated signals are inputted to the analog VSB audio processor 7 through the VSB tuner 15 and the band limiting filter 6.

When receiving digital VSB-modulated terrestrial signals, the digital VSB-modulated signals are inputted to the digital VSB processor 10 through the VSB tuner 15, the band limiting filter 12, and the VSB detector 14.

Figure 7:
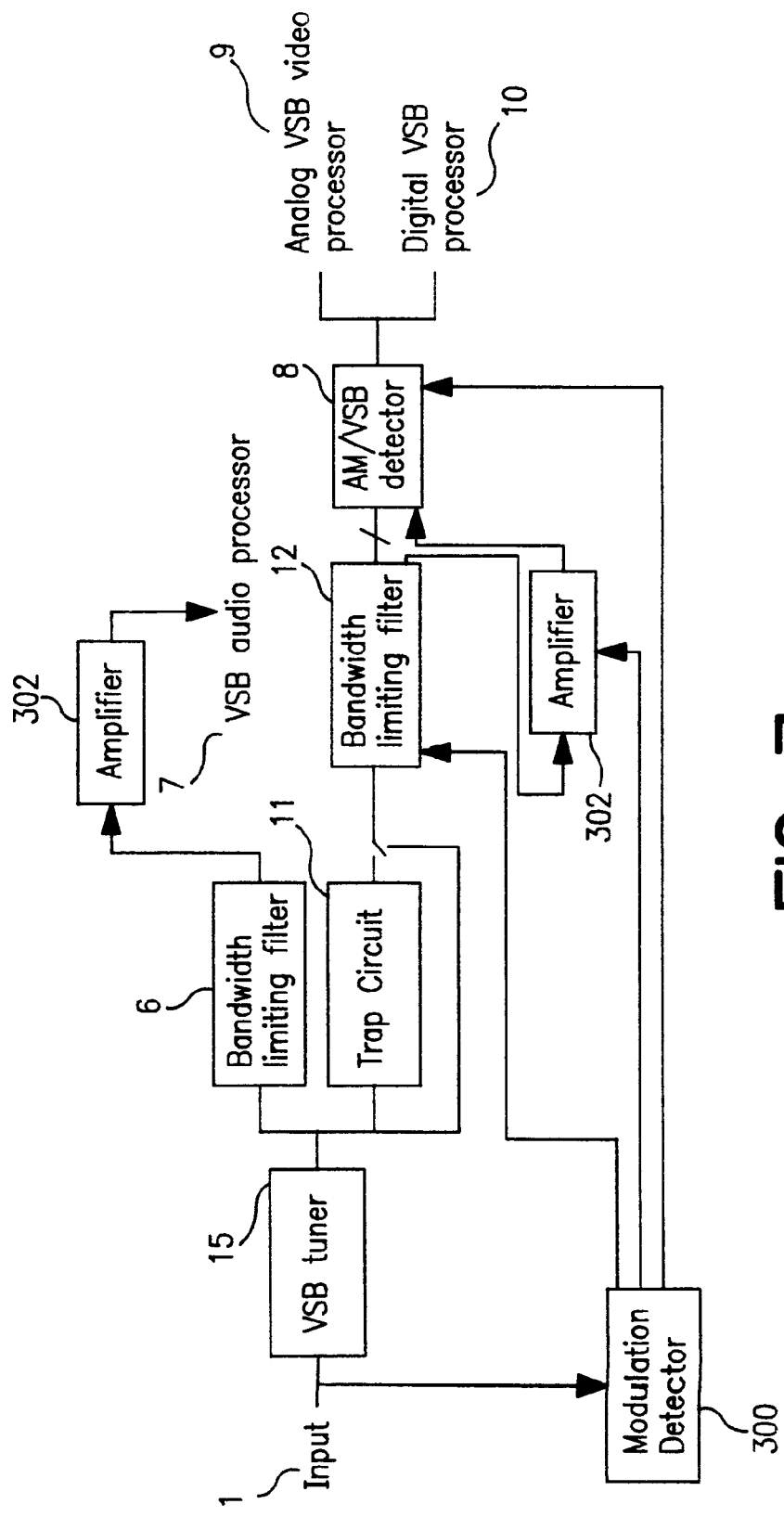
FIG. 7 shows a block-diagrammatic construction of a broadcast receiving apparatus in the seventh embodiment of the present invention.

Seventh Embodiment:

FIG. 7 shows a block-diagrammatic construction of a broadcast receiving apparatus up to the detector section in a further embodiment of the present invention. The tuning section consists of a VSB tuner 15 alone and is fed with various modulated signals through an input means 1. Modulation detector 300 detects the modulation scheme of the inputted modulated signals, and switches characteristics of one or more of the band limiting filter, the amplifier, and the detector. The first filtering section is provided with a trap circuit 11 for analog signals as in FIG. 2, a band limiting filter 12 for common use for analog and digital signals, and a band limiting filter 6 for audio signals, either one of which becoming operational by a switching means (such as a switch 1) depending on the type of output from a detection means to detect modulated signals being inputted. Amplifier 302 amplifies the output of the first filtering section. The detector section consists of an AM/VSB detector alone.

Referring to FIG. 7, frequency conversion to IF signals by using the same tuner, band limiting by using the same band limiting filter, and detecting by using the same detector, for AM-modulated terrestrial signals and for digital VSB-modulated terrestrial signals will be explained in the following. A VSB tuner 15 converts the analog VSB-modulated terrestrial signals and the digital VSB-modulated terrestrial signals to IF signals, a trap circuit 11 attenuates the audio carrier 17 of the analog VSB-modulated signals as shown in FIG. 15, a band limiting filter 12 limits the bands of the analog VSB-modulated signals and the digital VSB-modulated signals, a band limiting filter 6 extracts the audio carrier 17 from the analog VSB-modulated signals as converted to IF signals, an analog VSB audio processor 7 performs FM detection and audio processing on audio signals, an AM/VSB detector 8 detects the analog VSB-modulated signals and the digital VSB-modulated signals and converts to base-band signals, an analog VSB processor 9 performs video processing on AM-detected base-band signals, and a digital VSB processor 10 performs video processing and audio processing on the VSB-detected signals.

The AM/VSB detector 8 has a construction as shown in FIG. 18 in which only the Quadrature signals as shown in FIG. 21 and obtained by multiplying the local oscillation signals of a local oscillator 30 of the detector and the IF signals 23 by means of a mixer 28 are fed to an LPF 31 for conversion to an APC voltage 32, which is fed back to the local oscillator 30 of the AM detector for correction of any deviation in phase.

The trap circuit 11 has a frequency characteristic as shown in FIG. 22 and attenuates the audio carrier 17 at a frequency 4.5 MHz apart from the video carrier 19. The band limiting filter 12 to limit the bands of the analog VSB-modulated signals and the digital VSB-modulated signals has a frequency characteristic as shown in FIG. 17, a root raised cosine curve with a roll-off rate of 5.76%. The band limiting filter 6 to extract the audio carrier 17 at a frequency 4.5 MHz apart from the video carrier 19 attenuates the video carrier 19 and color sub-carrier 18 at a frequency 3.58 MHz apart from the video carrier 19.

When receiving analog VSB-modulated terrestrial signals, the video signals of the analog VSB-modulated signals are inputted to the analog VSB video processor 9 through the VSB tuner 15, the trap circuit 11, the band limiting filter 12, and the AM/VSB detector 8.

The audio signals of the analog VSB-modulated signals are inputted to the analog VSB audio processor 7 through the VSB tuner 15 and the band limiting filter 6.

When receiving digital VSB-modulated terrestrial signals, the digital VSB-modulated signals are inputted to the digital VSB processor 10 through the VSB tuner 15, the band limiting filter 12, and the AM/VSB detector 8.

Figure 8:
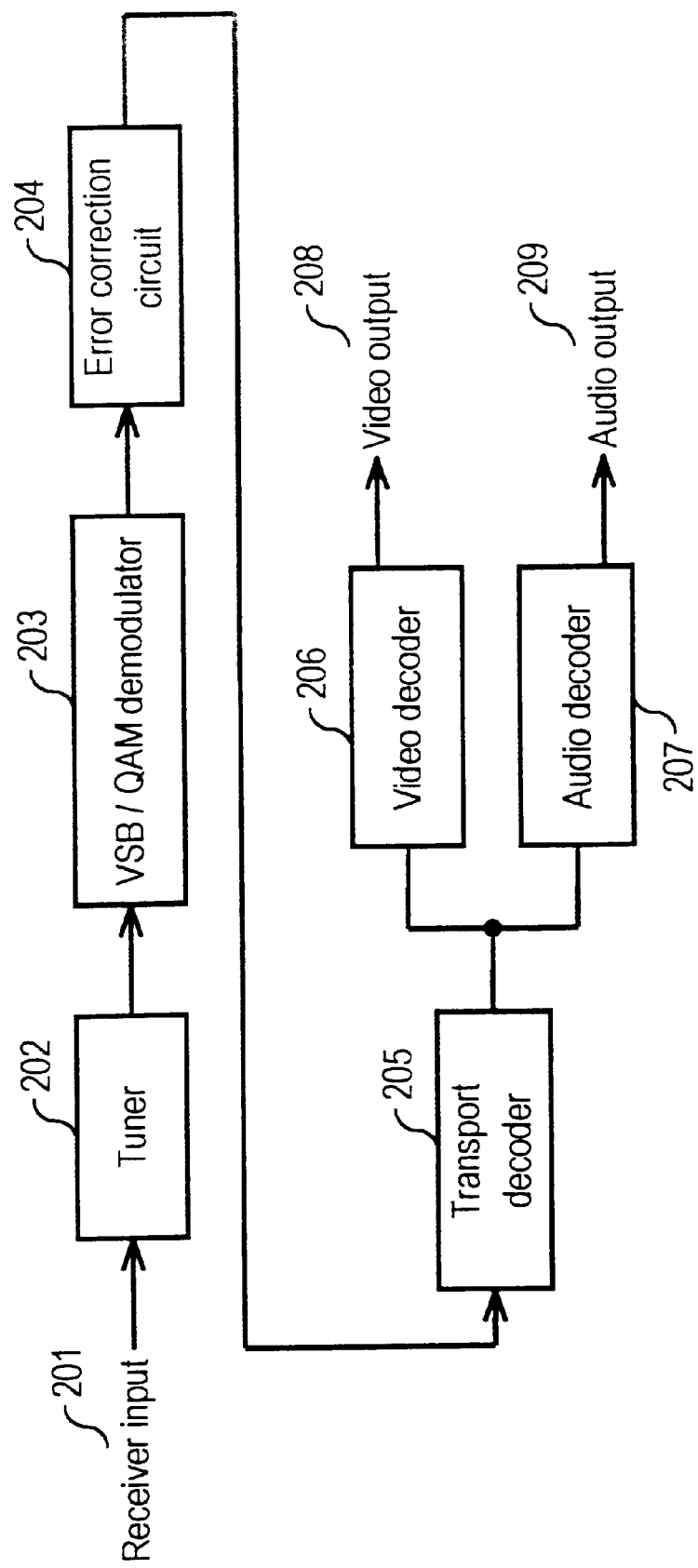
FIG. 8 shows a block-diagrammatic construction of the complete construction of a broadcast receiving apparatus in the eighth embodiment of the present invention.
Figure 9:
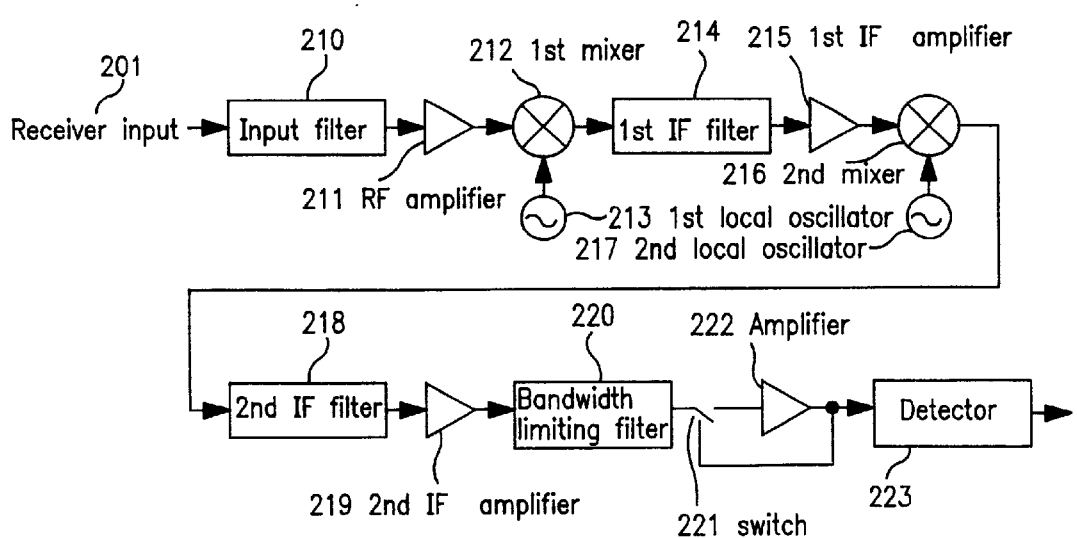
FIG. 9 shows a block-diagrammatic construction up to the detector of a broadcast receiving apparatus in the eighth embodiment of the present invention.

Eighth Embodiment:

FIG. 8 shows a block-diagrammatic construction up to the final video and audio output sections of a broadcast receiving apparatus in a further embodiment of the present invention. The tuning section consists of a tuner 202 alone and is fed with various modulated signals through an input means 1. The first filtering section, the detector section, and a part of the digital processing section are grouped as VSB/QAM demodulator 203. FIG. 9 shows detail construction of the tuning section up to the detector section of the VSB/QAM demodulator of a broadcast receiving apparatus of the present invention. Depending on the output of a detection means (not shown in the drawing) to detect modulation scheme of the incoming modulated signals at input 1, an amplifier 222 in the amplifying section is switched by a switching means 221.

Referring to FIGS. 8 and 9, details are explained in the following. In FIG. 8, 201 is a receiver input, 202 is a tuner, 203 is a VSB/QAM demodulator, 204 is an error correction circuit, 205 is a transport decoder, 206 is a video decoder, 207 is an audio decoder, 208 is video output, and 209 is audio output. In FIG. 9, 210 is an input filter, 211 is an RF amplifier, 212 is a first mixer, 213 is a first local oscillator, 214 is a first IF filter, 215 is a first IF amplifier, 216 is a second mixer, 217 is a second local oscillator, 218 is a second IF filter, 219 is a second IF amplifier, 220 is a band limiting filter, 221 is a switch, 222 is an amplifier, and 223 is a detector.

Operation of a receiving apparatus having above described construction is explained in the following referring to a case when 8VSB-, 16VSB-, or QAM-modulated signals are inputted. Data obtained through channel selection by the tuner 202, demodulation by the VSB/QAM demodulator 203, and error correction by the error correction circuit 204 are divided to packet units by the transport decoder 205. Video output is obtained by decompressing compressed video data by the video decoder 206, and audio output is obtained by decompressing compressed audio data by the audio decoder 207.

The tuner 202 is a double super heterodyne tuner in which signals fed at the input 201 of the receiving apparatus is channel-selected by the input filter 210, and after amplification by the RF amplifier 211, frequency-converted to the first IF signal by the first mixer 212. The first IF signal is set at a frequency higher than the input signal frequency of the receiving apparatus. The first IF signal is precisely filtered through the first IF filter 214, amplified by the first IF amplifier 215, and frequency-converted to a second IF signal by the second mixer 216. In the United States, the second IF signal is chosen to have a center frequency of 44 MHz. Further, after being precisely filtered through the second IF filter 218, the second IF signal is amplified by the second IF amplifier 219, and is rejected of signals from adjacent channels or from channels adjacent to adjacent channels by the band limiting filter 220 such as a SAW filter.

Next, when receiving 8VSB-modulated terrestrial signals, the switch 221 is switched over to the amplifier 222, and when receiving CATV 16VSB/QAM-modulated signals, the switch 211 is switched to bypass the amplifier 222 to allow direct input into the detector 223.

In this way, by employing a circuit construction to cope with the difference in the range of electric field strength between digital terrestrial broadcast and digital CATV broadcast, it becomes possible to receive both VSB-modulated signals and QAM-modulated signals with the same tuner by causing the digital terrestrial broadcast signals that may contain weak signals to pass through the amplifier 222, and the digital CATV broadcast signals which do not contain weak signals to bypass the amplifier 222.

Figure 10:
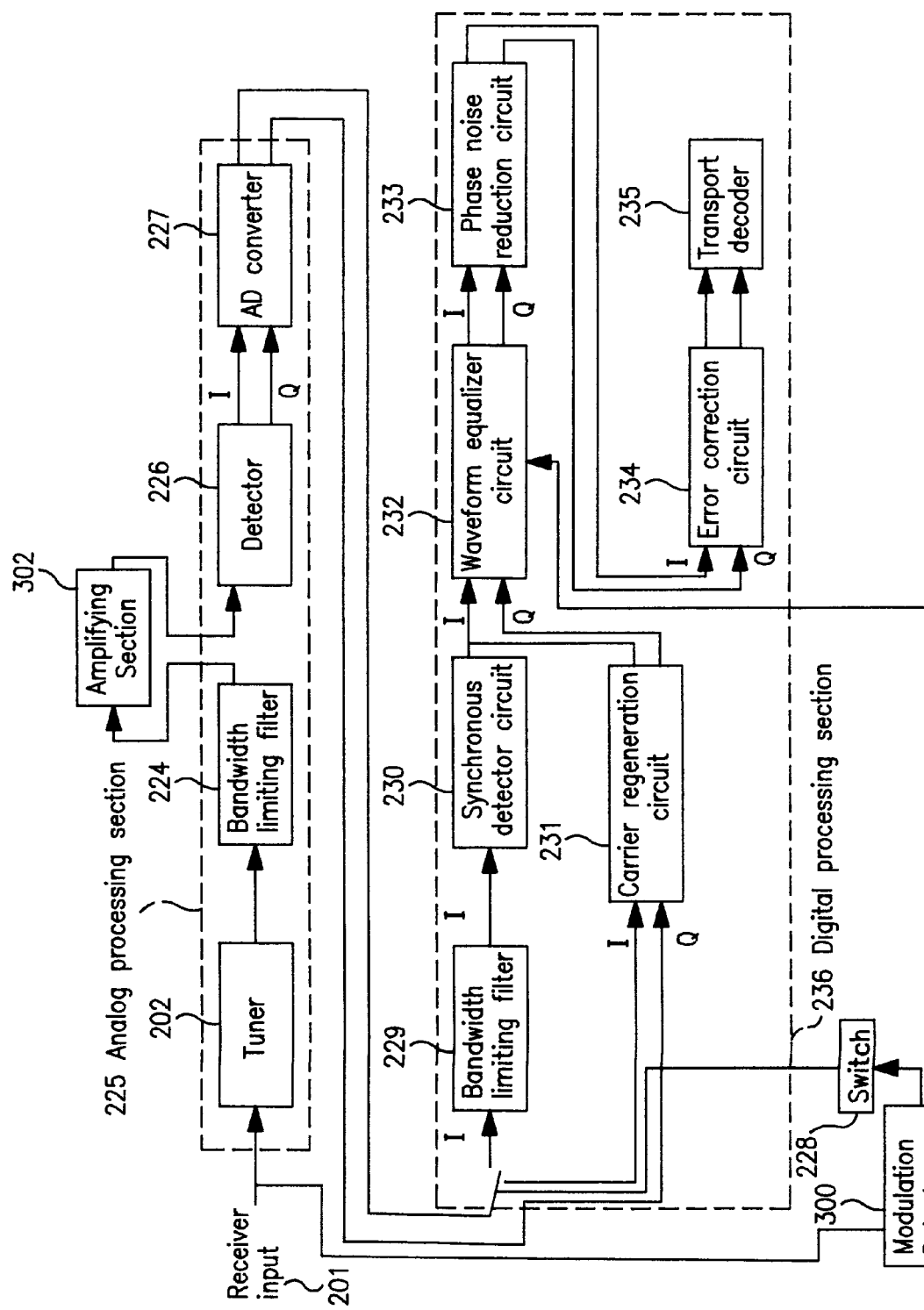
FIG. 10 shows a block-diagrammatic construction of a demodulator section in the ninth embodiment of the present invention.

Ninth Embodiment:

FIG. 10 is a block-diagrammatic construction up to the transport decoder 235 of a broadcast receiving apparatus in a further embodiment of the present embodiment omitting the final video and audio output sections shown in the Eighth Embodiment. The tuning section consists of a tuner 202 alone and is fed with various modulated signals through an input means 201. Modulation detector 300 detects the modulation scheme of the inputted modulated signals, and switches characteristics of the waveform equalizer 232 depending on the modulation scheme detected. The first filtering section consists of a band limiting filter 224, the amplifying section consists of an amplifier 302 for amplifying the output of the band limiting filter 224, the detector section consists of a detector 226, the section to perform digital processing follows an AD converter 227 and consists of a digital processing section 236. The digital processing section 236 has a switch 228 as an input means and comprises a band limiting filter 229 as the second filtering section, synchronous detection circuit 230, a carrier regeneration circuit 231, a waveform equalization circuit 232, a phase noise reduction circuit 233, an error correction circuit 234, and a transport decoder 235, The switch 228 is switched over depending on the output of a detection means (not shown in the drawing) to detect modulation schemes Referring to FIG. 10, the operation is explained in the following. When 8VSB- or 16VSB-modulated signals are inputted, they pass through the tuner 202, the band limiting filter 224 for QAM, the amplifier 302, the detector 226, the AD converter 227, the switch 228, and the band limiting filter 229 for VSB before being inputted to the synchronous detection circuit 230 thereby data solely consisting of Inphase data are processed in each block.

When QAM-modulated signals are inputted, they pass through the tuner 202, the band limiting filter 224 for QAM, the amplifier 302, the detector 226, the AD converter 227, and the switch 228 which has been turned over, before being inputted to the carrier regeneration circuit 231 thereby Inphase and Quadrature data are processed in each. block.

In this way, depending on which of the VSB-modulated signals and QAM. modulated signals are inputted, the processing route is switched over for different processing. Also, it is necessary to limit the bands of VSB-modulated signals and QAM-modulated signals using band limiting filters having different roll-off rates, namely, a roll-off rate of 5.76% for VSB and a roll-off rate of 13% for QAM. It has been experimentally confirmed that the performance of a broadcast receiving apparatus deteriorates when there is a large change in the group delay frequency characteristic within the band of the band limiting filter because the eye-pattern after detection deteriorates. In this embodiment, the band limiting filter 224 for QAM which limits the band of QAM-modulated signals has a larger roll-off rate than that for digital terrestrial VSB-modulated signals and has a 3 dB wider bandwidth than the band limiting filter for VSB. In this case, since it is easy to minimize the change in the group delay frequency characteristic that leads to performance deterioration of a broadcast receiving apparatus, the band limiting filter 224 for QAM consists of an analog band limiting filter. Also, in constructing the band limiting filter 229 for VSB which tends to have a large change in the group delay frequency characteristic when constructed with an analog filter such as a SAW filter having a small roll-off rate, it is possible to prevent performance deterioration of a broadcast receiving apparatus by employing a band limiting filter consisting of a digital filter.

Figure 11:
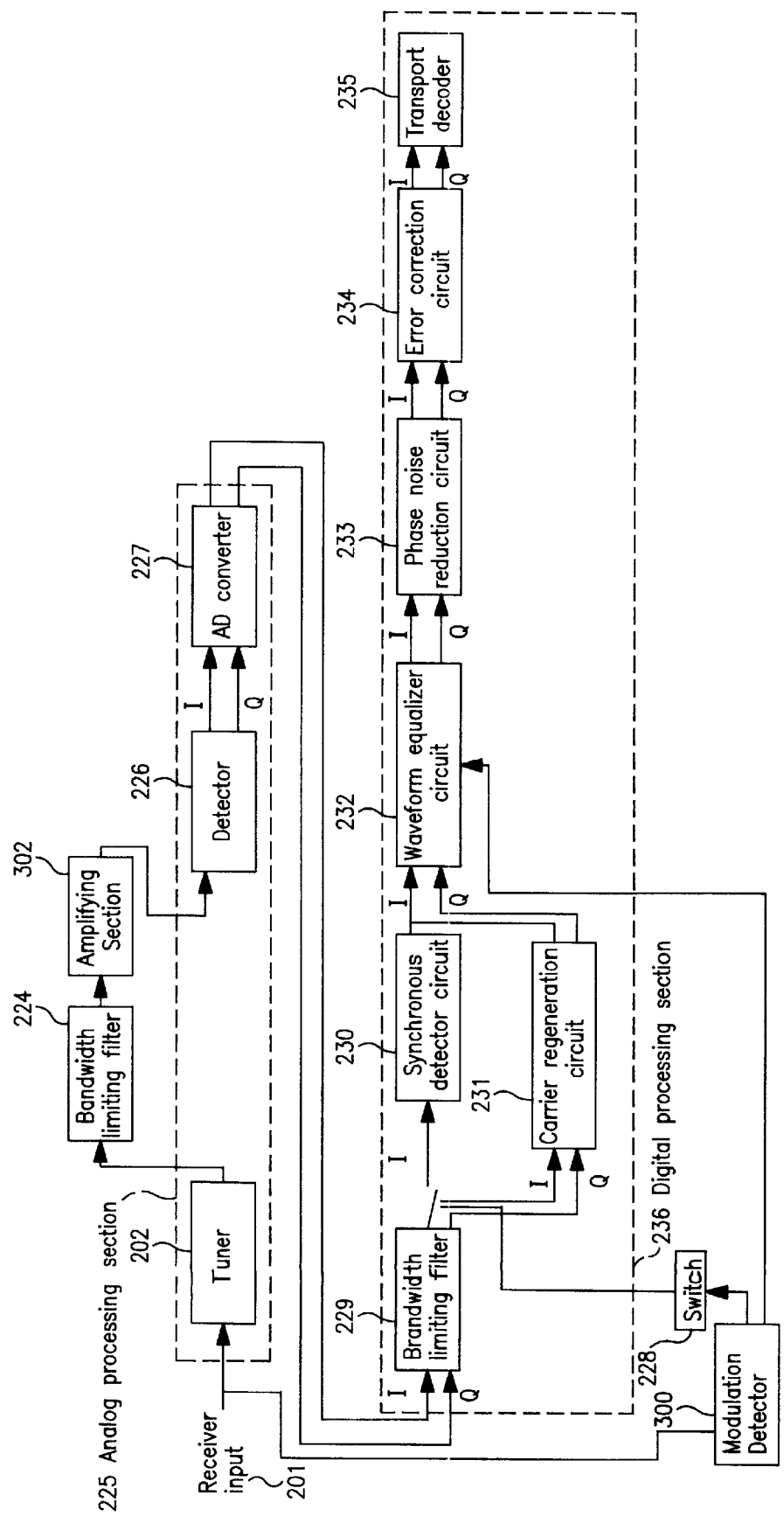
FIG. 11 shows a block-diagrammatic construction of a demodulator in the tenth embodiment of the present invention.

Tenth Embodiment:

FIG. 11 is a block-diagrammatic construction of a broadcast receiving apparatus in a further embodiment of the present invention up to the transport decoder 235 which precedes the final video and audio output sections not shown as is the case with the Ninth Embodiment. The tuning section consists of a tuner 202 alone and is fed with various modulated signals through an input means 210. The first filtering section, consists of a band limiting filter 224, the amplifying section consists of amplifier 302 for amplifying the output of the band limiting filter 224, the detector section consists of a detector 226, and the section to perform digital processing follows an AD converter 227 and consists of a digital processing section 236. The digital processing section 236 comprises a switch 228 as a switching means, a band limiting filter 229 that functions as the second filtering section, a synchronous detection circuit 230, a carrier regeneration circuit 231, a waveform equalization circuit 232, a phase noise reduction circuit 233, an error correction circuit 234, and a transport decoder 235. The switch 228 is switched over depending on the output of a detection means to detect the modulation schemes. Modulation detector 300 detects the modulation scheme of the inputted modulated signals, provides control to switch 228 and switches characteristics of the waveform equalizer 232 depending on the modulation scheme detected.

Figure 12:
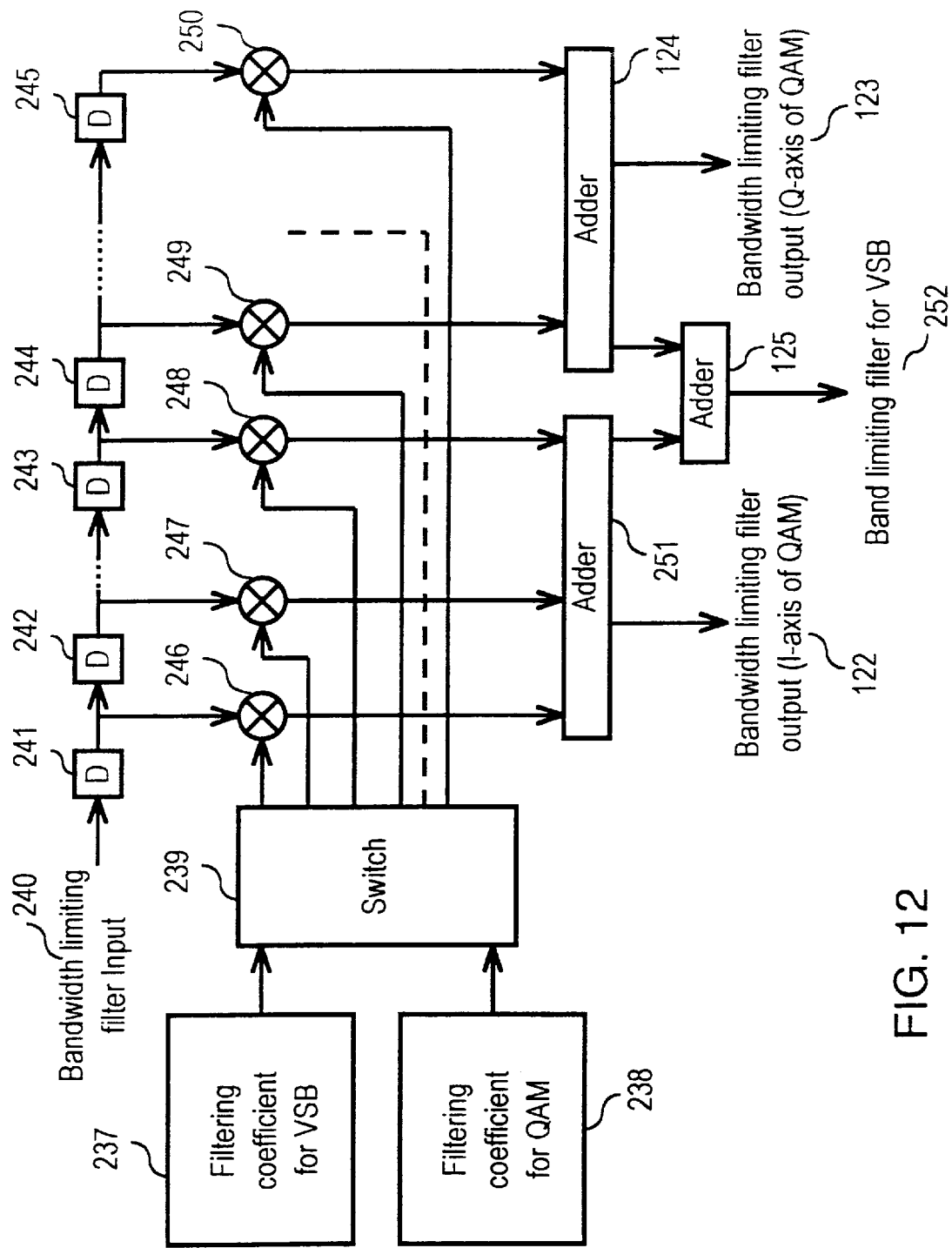
FIG. 12 shows a circuit construction of a band limiting filter in the tenth embodiment of the present invention.

FIG. 12 shows construction of the band limiting filter 229, where 237 is filtering coefficient for VSB, 238 is filtering coefficient for QAM, 239 is a switch as one of the switching means, 240 is an input to the band limiting filter, 241 to 245 are flip-flops (FF), 246 to 250 are multipliers, 251, 124, and 125 are adders, 122 is a band limiting filter output for Inphase of QAM, 123 is a band limiting filter output for Quadrature of QAM, and 252 is a band limiting filter output for VSB.

Referring to FIGS. 11 and 12, operation will be explained in the following. When receiving 8VSB- and 16VSB-modulated signals, the filtering coefficient 237 for VSB is inputted to the adders 246 to 250 by means of the switch 239 and, as a result, band-limited data is obtained from the band limiting filter 252 for VSB. On the other hand, when receiving QAM-modulated signals, the filtering coefficient 38 for QAM is inputted to the adders 246 to 250 by switching over the switch 239, and data band-limited on Inphase of the QAM-modulated signals is obtained from the output 122 of the band limiting filter for Inphase of QAM while data band-limited on Quadrature of the QAM-modulated signal is obtained from the output 123 of the band limiting filter for Quadrature of QAM.

Compared with the 8VSB- and 16VSB-modulated signals, the roll-off rate of band limiting filter for QAM-modulated signals is small and the number of stages of filters required for band limiting filter can be small. Therefore, when receiving QAM-modulated signals, it is possible to save power consumption by reducing the number of filter stages to be used and stop the operation of non-required FF's and adders by a switching means.

Figure 13:
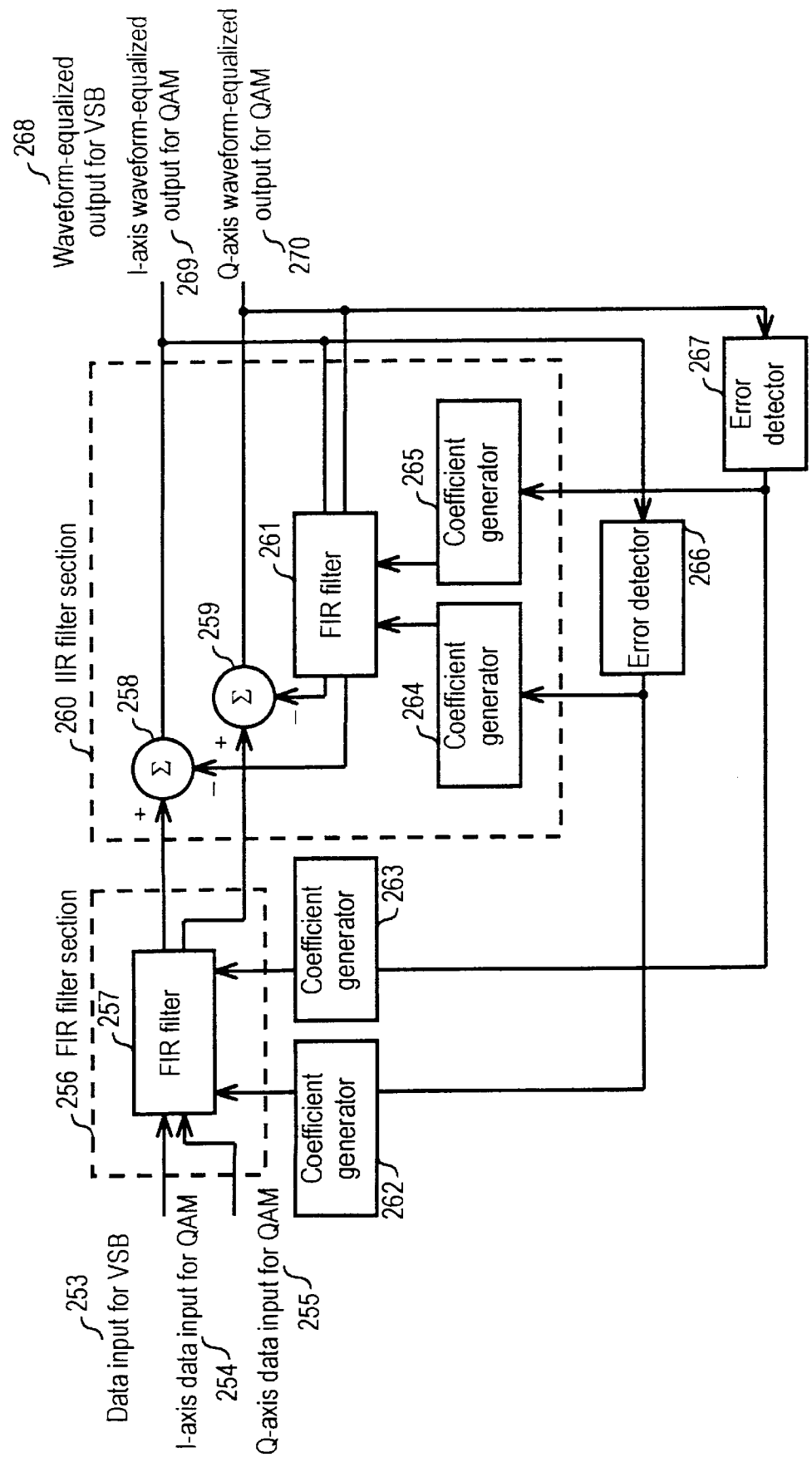
FIG. 13 shows a block-diagrammatic construction of a waveform equalizer in the eleventh embodiment of the present invention.
Figure 14:
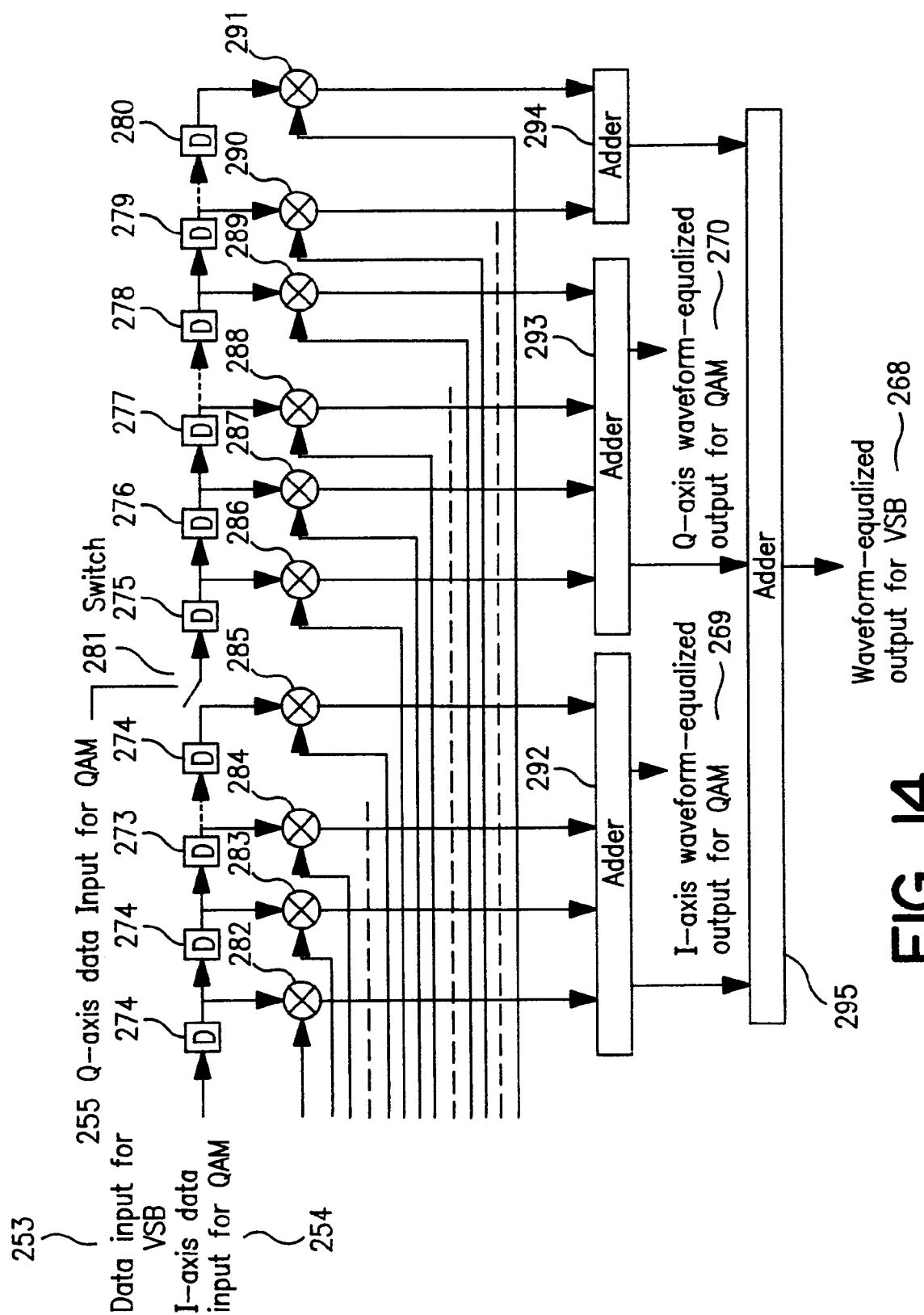
FIG. 14 shows a circuit construction of a waveform equalizer in the eleventh embodiment of the present invention.

Eleventh Embodiment:

FIG. 13 is a block-diagrammatic construction of a waveform equalizer as used in the digital processing section of a broadcast receiving apparatus in a further embodiment of the present invention. FIG. 14 shows the construction of an FIR filter of the waveform equalizer.

When receiving 8VSB-modulated terrestrial digital broadcast, a 64-tap filter in the FIR filtering section and a 192-tap filter in the IIR filtering section both in FIG. 13 are respectively required. On the other hand, when receiving QAM-modulated digital CATV broadcast signals, a 16-tap filter is required in the FIR filtering section for each of the Inphase and Quadrature, and in the IIR filtering section. Since the total number of taps required in the FIR filtering section and in the IIR filtering section even including the taps for Inphase and Quadrature required in receiving QAM-modulated signals is smaller than the number of taps required when receiving VSB-modulated signals, it is possible to use a waveform equalizer commonly for receiving VSB-modulated signals and for receiving QAM-modulated signals by designing for VSB-modulated signals.

Referring to FIGS. 13 and 14, switching operation for common use of tale waveform equalizer is explained in the following. 253 is a data input for VSB, 254 is an Inphase data input for QAM, 255 is a Quadrature data input for QAM, 256 is the FIR filtering section, 257 and 261 are the FIR filters, 258 and 259 are subtractors, 262 to 265 are coefficient generators, 266 and 267 are error detectors, 268 is waveform-equalized output for VSB, 269 is an Inphase waveform-equalized output for QAM, 270 is a Quadrature waveform-equalized output for QAM, 271 to 280 are FF's, 282 to 291 are multipliers, and 292 to 295 are adders.

Input to the waveform equalizer is made of 8VSB- and 16VSB-modulated signal data and of Inphase data of QAM-modulated signals through the same port.

When receiving 8VSB- and 16VSB-modulated signals, the modulation scheme of the incoming modulated signals is detected by a detection means (not shown in the drawings), depending on the result of which a switching means causes only the FIR filters 257 and 261, the subtractor 258, the error detector 266, and the coefficient generators 262 and 264 are caused to operate. Data of the VSB-modulated signals is inputted at the VSB data input 253, and put out from the waveform equalizer output for VSB 268 after passing through the FIR filtering section 256 and the IIR filtering section 260. The filtering coefficient of the FIR filter 257 is calculated by the coefficient generator 262 based on the error obtained by feeding the data of the waveform equalizer output for VSB 268 to the error detector 266. The filtering coefficient of the FIR filter 261 is calculated by the coefficient generator 264 based on the error obtained by feeding the date of the waveform equalizer output for VSB 268 to the error detector 266.

Similarly, when receiving QAM-modulated signals, the modulation scheme of the incoming modulated signals is detected by a detection means (not shown in the drawing), depending on the result of which a switching means causes the FIR filters 257 and 261, the subtractors 258 and 259, the error detectors 266 and 267, and the coefficient generators 262 to 265 to operate.

Inphase data of the QAM-modulated signals are inputted to the QAM Inphase data input 254, and put out from the QAM Inphase waveform equalizer output 269 after passing through the FIR filtering section 256 and the IIR filtering section 260. The filtering coefficient for use in the Inphase data of the QAM-modulated signals for the FIR filter 257 is calculated by the coefficient generator 262 based on the error obtained by feeding the data of QAM Inphase waveform equalizer output 269 to the error detector 266. Also, the filtering coefficient for use in the Inphase data of the QAM-modulated signals for the FIR filter 261 is calculated by the coefficient generator 264 based on the error obtained by feeding the data of QAM Inphase waveform equalizer output 269 to the error detector 266.

Quadrature data of the QAM-modulated signals are inputted to the QAM Quadrature data input 255, and put out from the QAM Quadrature waveform equalizer output 270 after passing through the FIR filtering section 256 and the IIR filtering section 260. The filtering coefficient for use in the Quadrature data of the QAM-modulated signals for the FIR filter 257 is calculated by the coefficient generator 263 based on the error obtained by feeding the data of QAM Quadrature waveform equalizer output 270 to the error detector 267. Also, the filtering coefficient for use ill the Quadrature data of the QAM-modulated signals for the FIR filter 261 is calculated by the coefficient generator 265 based on the error obtained by feeding the data of QAM Quadrature waveform equalizer output 270 to the error detector 267.

The FR filters 257 and 261 in the waveform equalizer circuit have a construction as shown in FIG. 13. Depending on the modulation scheme of the incoming modulated signals, switching is made by a switching means as described below.

When inputting data of 8VSB- and 16VSB-modulated signals to the waveform equalizer, the data for VSB data input 253 is fed to the FIR filter 257; then the data that passed the FF's 271 to 280 and the coefficient calculated by the coefficient generator 262 are multiplied by the multipliers 282 to 291, the respective data so multiplied are subsequently added by the adders 292 to 295, and the added data is put out from the FIR filter 257 as the waveform equalizer output for VSB.

When inputting Inphase data of QAM-modulated signals to the waveform equalizer, the data from QAM Inphase data input 254 is fed to the FIR filter 257; then the data that passed the FF's 271 to 274 and the coefficient calculated by the coefficient generator 262 are multiplied by the multipliers 282 to 285, the respective data so multiplied are subsequently added by the adder 292, and the added data is put out from the FIR filter 257 as the QAM Inphase data.

When inputting Quadrature data of QAM-modulated signals to the waveform equalizer, the data from QAM Quadrature data input 255 is fed to the FIR filter 257; then the data that passed the FF's 275 to 278 and the coefficient calculated by the coefficient generator 263 are multiplied by the multipliers 286 to 289, the respective data so multiplied are subsequently added by the adder 293, and the added data is put out from the FIR filter 257 as the QAM Quadrature data.

Similarly, when inputting data of 8VSB- and 16VSB-modulated signals to the waveform equalizer, the data from VSB waveform equalizer output 268 is fed to the FIR filter 261; then the data that passed the FF's 271 to 280 and the coefficient calculated by the coefficient generator 264 are multiplied by the multipliers 282 to 291, the respective data so multiplied are subsequently added by the adders 292 to 295, and the added data is put out from the FIR filter 261 as the VSB data output.

When inputting Inphase data of QAM-modulated signals to the waveform equalizer, the data from the Inphase waveform-equalized output for QAM 269 is fed to the FIR filter 261; then the data that passed the FF's 271 to 274 and the coefficient calculated by the coefficient generator 264 are multiplied by the multipliers 282 to 235, the respective data so multiplied are subsequently added by the adder 269, and the added data is put out from the FIR filter 261 as the QAM Inphase data.

When inputting Quadrature data of QAM-modulated signals to the waveform equalizer, the data from the Quadrature waveform-equalized output for QAM 270 is fed to the FIR filter 261; then the data that passed the FF's 275 to 278 and the coefficient calculated by the coefficient generator 265 are multiplied by the multipliers 286 to 289, the respective data so multiplied are subsequently added by the adder 270, and the added data is put out from the FIR filter 261 as the QAM Quadrature data.

When receiving QAM-modulated signals, energy saving can also be made by stopping the operation of FF's 279 and 280, the multipliers 290 and 291, and the adder 294.

The broadcast receiving apparatus in accordance with the present invention comprising a detection means to detect the modulation scheme of incoming modulated signals and a switching means to switch the characteristic of one or more of the band limiting filter section, the amplifying section, the detector section and the digital processor section depending on the modulation scheme detected by the detection means provides multifunctionality to cope with emerging broadcast based on a variety of coexisting modulation schemes including analog AM-modulated signals, digital VSB-modulated signals, digital terrestrial 8VSB-modulated signals, digital CATV 16VSB-modulated signals, and QAM-modulated signals, and simplicity in the circuit construction.

What is claimed is:
1. A broadcast receiving apparatus comprising
   a tuning section to be fed with modulated signals,
   a first filtering section to be fed with signals that have been selected by said tuner and frequency-converted to an intermediate frequency signal and to limit the bandwidth thereof to extract a desired signal,
   an amplifying section to amplify the output of said first filtering section,
   a detection section to detect the output of said amplifier and to convert to a base-band signal, an input means to feed various modulated signals to said tuner, a detection means to detect the modulation scheme of the inputted modulated signals, and a switching means to switch characteristic of one or more of said first filtering section, amplifying section, and detector section depending on the modulation scheme detected by said detection means.

2. A broadcast receiving apparatus as recited in claim 1, comprising a digital processing section to process the output of said detector section, an A/D conversion section to convert analog signals to digital signals, a second filtering section to limit the bandwidth thereof to extract desired signal from the output of said A/D conversion section, and said switching means to switch characteristic of said second band limiting filter section depending on the modulation scheme detected by said detection means.

3. A broadcast receiving apparatus as recited in claim 1 comprising a digital processing section to process output of said detector section, an A/D conversion section to convert analog signals to digital signals, a second filtering section to limit the bandwidth thereof to extract desired signal from the output of said A/D conversion section, a waveform equalization section for waveform equalization of signals from said second filtering section, and said switching means to switch characteristic of said waveform equalization section depending on the modulation scheme detected by said detection means.

4. A broadcast receiving apparatus as recited in claim 1, wherein a local oscillator to be used as a detector in the detection section for VSB detection of digital VSB-modulated terrestrial signals consists of a crystal oscillator.

5. A broadcast receiving apparatus comprising a tuning section to be fed with modulated signals, a first filtering section to be fed with signals that have been selected by said tuning section and frequency-converted to an intermediate frequency signal and to limit the bandwidth thereof to extract a desired signal, an amplifying section to amplify the output of said first filtering section, a detection section to detect output of said amplifying section and to convert to a base-band signal, an input means to feed various modulated signals to said tuning section, wherein said tuning section has a tuner for frequency conversion of analog VSB-modulated terrestrial signals and digital VSB-modulated terrestrial signals, and a trap circuit is provided which, when receiving analog VSB-modulated terrestrial signals, attenuates audio carrier of the analog VSB-modulated signals before the signals pass through said first filtering section to limit the band of the analog VSB-modulated signals and digital VSB-modulated signals.

6. A broadcast receiving apparatus as recited in claim 5, wherein the band limiting filter which limits the bands of analog VSB-modulated signals and digital VSB modulated signals is a root raised cosine filter having a roll-off rate of 5.76% when receiving analog VSB-modulated terrestrial signals.

7. A broadcast receiving apparatus comprising, a tuner to be fed with modulated signals.

a first filtering section to be fed with signals that have been selected by said tuner and frequency-converted to an intermediate frequency signal and to limit the bandwidth thereof to extract a desired signal, an amplifying section to amplify the output of said first filtering section, a detection section having a local oscillator and to detect output of said amplifying section and to convert to a base-band signal, an input means to feed said modulated signals to said tuner, wherein said detection section uses the same detector for analog vestigial-sideband (VSB)-modulated terrestrial signals and digital VSB-modulated terrestrial signals, and the phase of the signals fed to said detector is locked only in-phase, wherein the detector for VSB detection of analog VSB-modulated terrestrial signals and digital VSB-modulated terrestrial signals feeds back to a local oscillator an auto-phase-control voltage obtained by passing through a low pass filter a Quadrature signal which is obtained by multiplying the local oscillation signal of the local oscillator of said detector and the intermediate frequency signal.

8. A broadcast receiving apparatus comprising a tuning section to be fed with modulated signals, a first filtering section to be fed with signals that have been selected by said tuning section and frequency-converted to an intermediate frequency signal and to limit the bandwidth thereof to extract a desired signal, an amplifying section to amplify the output of said first filtering section, a detection section to detect the output of said amplifying section and to convert to a base-band signal, an input means to feed various modulated signals to said tuning section, a detection means to detect the modulation scheme of the inputted modulated signals, and a switching means to switch characteristic of one or more of said first filtering section, amplifying section, and detection section depending on the modulation scheme detected by said detection means, wherein the gain from said input means to said detection section is controlled by switching by said switching means depending on the modulation scheme detected by said detection means thereby stabilizing the level of input to said detection section.

9. A broadcast receiving apparatus as recited in claim 8, wherein when the input to the input means is 8VSB-modulated signals of digital terrestrial broadcast, or QAM-modulated signals and 16VSB-modulated signals of digital CATV broadcast, the gain until detection is caused to change by a certain value when receiving 8VSB-modulated signals and receiving QAM-modulated signals and 16VSB-modulated signals.

10. A broadcast receiving apparatus as recited in claim 8, wherein when the input to the input means is 8VSB-modulated signals of digital terrestrial broadcast, or QAM-modulated signals and 16VSB-modulated signals of digital CATV broadcast, the gain until detection is caused to change by a certain value by using an amplifier in the amplifying section when receiving 8VSB-modulated signals, and not using the amplifier in said amplifying section when receiving QAM-modulated signals and 16VSB-modulated signals.

11. A broadcast receiving apparatus comprising a tuning section to be fed with modulated signals, a first filtering section to be fed with signals that have been selected by said tuning section and frequency-converted to an intermediate frequency signal and to limit the band thereof to extract a desired signal, an amplifying section to amplify the output of said first filtering section, a detection section to detect the output of said amplify section and to convert to a base-band signal, an input means to feed various modulated signals to said tuning section, a detection means to detect the modulation scheme of the inputted modulated signals, a switching means to switch depending on the modulation scheme detected by said detection means, a digital processing section to process the output of the detection section, an A/D conversion section to convert analog signals to digital signals, a second filtering section which limits the band to extract a desired signal from the output of said A/D conversion section, wherein when incoming signals to the input means are 8VSB- and 16VSB-modulated signals and QAM-modulated signals, depending on the output of said detection means, band limiting is done by passing the signals through the band limiting filter for QAM-modulated signals in the intermediate frequency band in the first band limiting filter section when receiving QAM-modulated signals, whereas when receiving 8VSB- and 16VSB-modulated signals, band limiting is done by passing the signals through said band limiting filter for QAM-modulated signals in the intermediate frequency band and also the band limiting filter for VSB-modulated signals as a second band limiting filter after said A/D conversion.

12. A broadcast receiving apparatus comprising a tuning section to be fed with modulated signals, a first filtering section to be fed with signals that have been selected by said tuning section and frequency-converted to an intermediate frequency signal and to limit the bandwidth thereof to extract a desired signal, an amplifying section to amplify the output of said first filtering section, a detection section to detect the output of said amplifying section and to convert to a base-band signal, an input means to feed various modulated signals to said tuning section, a detection means to detect the modulation scheme of the inputted modulated signals, a switching means to switch mode of signal processing depending on the modulation scheme detected by said detection means, a digital processing section to process the output of the detection section, an A/D conversion section to convert analog signals to digital signals, a second filtering section which limits the bandwidth thereof to extract a desired signal from the output of said A/D conversion section, wherein, when incoming signals to the input means are 8VSB- and 16VSB-modulated signals and QAM-modulated signals, the signals are allowed to pass the same band limiting digital filter as said second band limiting filter after said A/D conversion both when receiving QAM-modulated signals and when receiving VSB-modulated signals, and the coefficient of band limiting digital filter is switched by said switching means depending on the output of said detection means.

13. A broadcast receiving apparatus comprising a tuning section to be fed with modulated signals, a first filtering section to be fed with signals that have been selected by said tuning section and frequency-converted to an intermediate frequency signal and to limit the bandwidth thereof to extract a desired signal an amplifying section to amplify the output of said first filtering section, a detection section to detect the output of said amplifying section and to convert to a base-band signal, an input means to feed various modulated signals to said tuning section, a detection means to detect the modulation scheme of the inputted modulated signals, an A/D conversion section to convert analog signals to digital signals, a second filtering section which limits the bandwidth thereof to extract a desired signal from the output of said A/D conversion section, and a waveform equalization section to equalize the waveform of the signal from the second filtering section, wherein, when incoming signals to the input means are 8VSB- and 16VSB-modulated signals and QAM-modulated signals, a common digital filter is used in said waveform equalizer after said A/D conversion when receiving 8VSB- and 16VSB-modulated signals and when receiving QAM-modulated signals.

14. A broadcast receiving apparatus comprising a tuning section to be fed with modulated signals, a first filtering section to be fed with signals that have been selected by said tuning section and frequency-converted to an intermediate frequency signal and to limit the bandwidth thereof to extract a desired signal, an amplifying section to amplify the output of said first filtering section, a detection section to detect the output of said amplifying section and to convert to a base-band signal, an input means to feed various modulated signals to said tuning section, a detection means to detect the modulation scheme of the inputted modulated signals, a switching means to switch mode of signal processing depending on the modulation scheme detected by said detection means, a digital processing section to process the output of the detection section, an A/D conversion section to convert analog signals to digital signals, a second filtering section which limits the bandwidth to extract a desired signal from the output of said A/D conversion section, and a waveform equalization section comprising digital filters having flips flops (FF's) to equalize the waveform of the signals from the second filtering section, wherein, when the incoming signals to the input means are 8VSB- and 16VSB-modulated signals and QAM-modulated signals, characteristic of said waveform equalization section is switched as described below depending on the modulation scheme detected by said detection means: when receiving 8VSB-modulated and 16VSB-modulated signals, all of the FF's and multipliers of the digital filters in said waveform equalization section are used as the digital filter of said waveform equalization section, while when receiving QAM-modulated signals, a limited number of the FF's and multipliers as required as the digital filter for processing Inphase signal in the QAM-modulated signals are used in a part of the digital filter of said waveform equalization section, and a limited number of the FF's and multipliers as required as the digital filter for processing Quadrature signal in the QAM-modulated signals are used in a part of the digital filter of said waveform equalization section, thereby switching input and output of the digital filter of said waveform equalization section.

* * * * *